(12) United States Patent
Konishi et al.

(10) Patent No.: US 9,728,697 B2
(45) Date of Patent: Aug. 8, 2017

(54) LIGHT EMITTING DEVICE INCLUDING A METAL SUBSTRATE FOR HIGH HEAT DISSIPATION AND INCREASED LIGHT EFFICIENCY

(71) Applicant: Sharp Kabushiki Kaisha, Osaka-shi, Osaka (JP)

(72) Inventors: Masahiro Konishi, Osaka (JP); Hiroyuki Nokubo, Osaka (JP); Shin Itoh, Osaka (JP); Takashi Nakanishi, Osaka (JP); Ippei Yamaguchi, Osaka (JP); Yuhsuke Fujita, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/022,603

(22) PCT Filed: Oct. 1, 2014

(86) PCT No.: PCT/JP2014/076296
§ 371 (c)(1),
(2) Date: Mar. 17, 2016

(87) PCT Pub. No.: WO2015/050164
PCT Pub. Date: Apr. 9, 2015

(65) Prior Publication Data
US 2016/0233401 A1    Aug. 11, 2016

(30) Foreign Application Priority Data
Oct. 3, 2013   (JP) .................................. 2013-208557

(51) Int. Cl.
*H01L 33/64*   (2010.01)
*H01L 33/60*   (2010.01)
(Continued)

(52) U.S. Cl.
CPC ............ *H01L 33/641* (2013.01); *H01L 33/60* (2013.01); *H01L 33/62* (2013.01); *H05K 1/0203* (2013.01);
(Continued)

(58) Field of Classification Search
CPC ....... H01L 33/64; H01L 33/486; H01L 33/48; H01L 33/483; H01L 33/62; H01L 33/647;
(Continued)

(56) References Cited

U.S. PATENT DOCUMENTS

2011/0068674 A1* 3/2011 Takenaka .................. F21K 9/23
   313/318.07
2011/0116252 A1* 5/2011 Agatani ..................... F21K 9/00
   362/84
(Continued)

FOREIGN PATENT DOCUMENTS

CN   102192423 A   9/2011
CN   102315364 A   1/2012
(Continued)

OTHER PUBLICATIONS

Official Communication issued in International Patent Application No. PCT/JP2014/076296, mailed on Nov. 11, 2014.

*Primary Examiner* — Evan Pert
*Assistant Examiner* — Changhyun Yi
(74) *Attorney, Agent, or Firm* — Keating & Bennett, LLP

(57) ABSTRACT

A light emitting device achieving a high heat dissipation effect and a high light utilization efficiency includes an aluminum substrate, a high heat dissipation ceramic layer on the aluminum substrate, an etching frame on the high heat dissipation ceramic layer, and a highly reflective ceramic layer on the high heat dissipation ceramic layer and the etching frame.

20 Claims, 22 Drawing Sheets

1: ALUMINUM SUBSTRATE
2: HIGH HEAT DISSIPATION CERAMIC LAYER
3: ETCHING FRAME
4: HIGHLY REFLECTIVE CERAMIC LAYER
5: LED CHIP
100: LIGHT EMITTING DEVICE

(51) Int. Cl.
*H01L 33/62* (2010.01)
*H05K 1/02* (2006.01)
*H01L 25/075* (2006.01)
*H05K 1/05* (2006.01)
*H05K 3/00* (2006.01)
*H05K 3/04* (2006.01)
*H05K 3/20* (2006.01)
*H05K 3/28* (2006.01)

(52) U.S. Cl.
CPC ........ *H05K 1/0274* (2013.01); *H01L 25/0753* (2013.01); *H01L 2924/0002* (2013.01); *H01L 2933/0058* (2013.01); *H01L 2933/0066* (2013.01); *H01L 2933/0075* (2013.01); *H05K 1/053* (2013.01); *H05K 3/0061* (2013.01); *H05K 3/045* (2013.01); *H05K 3/202* (2013.01); *H05K 3/28* (2013.01); *H05K 2201/10106* (2013.01); *H05K 2201/2054* (2013.01)

(58) Field of Classification Search
CPC ..... H01L 25/0753; H01L 33/60; H01L 33/58; H01L 33/50
USPC ............................... 257/98; 438/29; 174/255
See application file for complete search history.

(56) References Cited

U.S. PATENT DOCUMENTS

| | | | |
|---|---|---|---|
| 2011/0132644 A1* | 6/2011 | Nishi | H05K 1/056 174/255 |
| 2011/0220939 A1 | 9/2011 | Nakayama | |
| 2012/0002420 A1 | 1/2012 | Imai et al. | |
| 2012/0230043 A1* | 9/2012 | Kitagawa | H05K 1/0373 362/382 |
| 2012/0273034 A1* | 11/2012 | Sato | H01L 31/0392 136/252 |
| 2015/0237710 A1* | 8/2015 | Yano | H05K 1/0207 174/255 |

FOREIGN PATENT DOCUMENTS

| | | |
|---|---|---|
| JP | 59-149958 A | 8/1984 |
| JP | 11-126795 A | 5/1999 |
| JP | 2006-091744 A | 4/2006 |
| JP | 2008-205453 A | 9/2008 |
| JP | 2012-004553 A | 1/2012 |
| JP | 2012-243846 A | 12/2012 |
| JP | 2013-187269 A | 9/2013 |
| WO | 2009/145109 A1 | 12/2009 |

* cited by examiner

1: ALUMINUM SUBSTRATE
2: HIGH HEAT DISSIPATION CERAMIC LAYER
3: ETCHING FRAME
4: HIGHLY REFLECTIVE CERAMIC LAYER
5: LED CHIP
100: LIGHT EMITTING DEVICE

1: ALUMINUM SUBSTRATE
12: HIGH HEAT DISSIPATION CERAMIC PAINT

1: ALUMINUM SUBSTRATE
2: HIGH HEAT DISSIPATION CERAMIC LAYER
3: ETCHING FRAME

1: ALUMINUM SUBSTRATE
2: HIGH HEAT DISSIPATION CERAMIC LAYER
3: ETCHING FRAME
14: HIGHLY REFLECTIVE CERAMIC PAINT

1: ALUMINUM SUBSTRATE
2: HIGH HEAT DISSIPATION CERAMIC LAYER
3: ETCHING FRAME
4: HIGHLY REFLECTIVE CERAMIC LAYER

1: ALUMINUM SUBSTRATE
2: HIGH HEAT DISSIPATION CERAMIC LAYER
3: ETCHING FRAME
4: HIGHLY REFLECTIVE CERAMIC LAYER

1: ALUMINUM SUBSTRATE
3: ETCHING FRAME
5: LED CHIP
102: PFA SHEET
200: LIGHT EMITTING DEVICE

1: ALUMINUM SUBSTRATE
102: PFA SHEET

1: ALUMINUM SUBSTRATE
3: ETCHING FRAME
102: PFA SHEET

1: ALUMINUM SUBSTRATE
3: ETCHING FRAME
102: PFA SHEET

1: ALUMINUM SUBSTRATE
3: ETCHING FRAME
102: PFA SHEET

5: LED CHIP
201: COPPER SUBSTRATE
202: PTFE SHEET
203: ETCHING FRAME
204: INORGANIC RESIST LAYER
206: ADHESIVE
207: HEATSINK
300: LIGHT EMITTING DEVICE

201: COPPER SUBSTRATE
202: PTFE SHEET
213: COPPER PLATE

201: COPPER SUBSTRATE
202: PTFE SHEET
213: COPPER PLATE

201: COPPER SUBSTRATE
202: PTFE SHEET
203: ETCHING FRAME
205: CHEMICAL-RESISTANT PROTECTIVE SHEET

201: COPPER SUBSTRATE
202: PTFE SHEET
203: ETCHING FRAME
204: INORGANIC RESIST LAYER

5: LED CHIP
201: COPPER SUBSTRATE
202: PTFE SHEET
203: ETCHING FRAME
204: INORGANIC RESIST LAYER 400, 500: LIGHT EMITTING DEVICE
401: METAL SUBSTRATE
403: WIRING PATTERN
405: LED CHIP
406: LIGHT REFLECTIVE RESIN FRAME
407: PHOSPHOR-CONTAINING SEAL RESIN
408: ANODE
409: CATHODE
410: ANODE MARK
411: CATHODE MARK

400: LIGHT EMITTING DEVICE
401: METAL SUBSTRATE
402: FIRST INSULATING LAYER
403: WIRING PATTERN
404: SECOND INSULATING LAYER
405: LED CHIP
406: LIGHT REFLECTIVE RESIN FRAME
407: PHOSPHOR-CONTAINING SEAL RESIN
408: ANODE
409: CATHODE
415: REAR ELECTRODE
412: THREAD PORTION

401: METAL SUBSTRATE
403: WIRING PATTERN
405: LED CHIP
406: LIGHT REFLECTIVE RESIN FRAME
407: PHOSPHOR-CONTAINING SEAL RESIN
408: ANODE
409: CATHODE
415: REAR ELECTRODE
412: THREAD PORTION
500: LIGHT EMITTING DEVICE
502: INSULATING LAYER

405: LED CHIP
408: ANODE
409: CATHODE
410: ANODE MARK
411: CATHODE MARK
603 (LEFT SIDE): WIRING PATTERN (ANODE SIDE)
603 (RIGHT SIDE): WIRING PATTERN (CATHODE SIDE)

701: ELECTRONIC CIRCUIT BOARD
707: PHOSPHOR-CONTAINING SEAL RESIN COATING AREA
708: ANODE
709: CATHODE

701: ELECTRONIC CIRCUIT BOARD
703: WIRING PATTERN
707: PHOSPHOR-CONTAINING SEAL RESIN COATING AREA

701: ELECTRONIC CIRCUIT BOARD
704: INSULATING LAYER
707: PHOSPHOR-CONTAINING SEAL RESIN COATING AREA
708: ANODE
709: CATHODE

301: ALUMINUM SUBSTRATE
302: EPOXY RESIN SHEET
311: ANODIZED ALUMINUM PROTECTIVE LAYER
313: COPPER PLATE

301: ALUMINUM SUBSTRATE
302: EPOXY RESIN SHEET
311: ANODIZED ALUMINUM PROTECTIVE LAYER
313: COPPER PLATE

301: ALUMINUM SUBSTRATE
302: EPOXY RESIN SHEET
303: ETCHING FRAME
311: ANODIZED ALUMINUM PROTECTIVE LAYER

301: ALUMINUM SUBSTRATE
302: EPOXY RESIN SHEET
303: ETCHING FRAME
304: INORGANIC RESIST LAYER
311: ANODIZED ALUMINUM PROTECTIVE LAYER

5: LED CHIP
301: ALUMINUM SUBSTRATE
302: EPOXY RESIN SHEET
303: ETCHING FRAME
304: INORGANIC RESIST LAYER
311: ANODIZED ALUMINUM PROTECTIVE LAYER

LIGHT EMITTING DEVICE INCLUDING A METAL SUBSTRATE FOR HIGH HEAT DISSIPATION AND INCREASED LIGHT EFFICIENCY

TECHNICAL FIELD

The present invention relates to a substrate for a light emitting device including an insulating layer on a metal substrate portion containing a base substrate composed of a metal material, a light emitting device including the substrate for a light emitting device, and a method for manufacturing the substrate for a light emitting device.

BACKGROUND ART

To date, electronic devices including electronic circuit boards are known. In electronic circuit boards, electronic elements, e.g., light emitting elements typified by LEDs (light emitting diodes) and thermoelements, are arranged.

An electronic circuit board in which an insulating layer is disposed on a metal substrate is known as an example of an electronic circuit board. For example, PTL 1 discloses a technology in which a base substrate is coated with a ceramic paint and firing is performed so as to form a coating film on the resulting base substrate.

CITATION LIST

Patent Literature

PTL 1: Japanese Unexamined Patent Application Publication No. 59-149958 (published on Aug. 28, 1984)

SUMMARY OF INVENTION

Technical Problem

In order to realize a high-output light emitting device, it is necessary to enhance the effect of dissipating the heat generated by a light emitting element and the like. In this regard, ceramic substrates used in the related art have poor thermal conductivity. Consequently, in a light emitting device, a metal substrate having thermal conductivity higher than the thermal conductivity of the ceramic substrate used in the related art has to be used.

Here, in order to mount the light emitting element on the metal substrate, an insulating layer has to be disposed on the metal substrate for the purpose of forming a wiring pattern. Also, in order to improve the light utilization efficiency of the light emitting device, the insulating layer needs to have high light reflectivity in addition to high thermal conductivity.

However, sufficient thermal conductivity, heat resistance, and light fastness have not been obtained by an organic resist used as the insulating layer in the electronic circuit board of the light emitting device in the related art.

Also, in order to improve the light utilization efficiency, the light that leaks through the insulating layer to the metal substrate side has to be reflected, but sufficient light reflectivity is not obtained by the configuration in the related art wherein the organic resist is used as the insulating layer.

PTL 1 does not refer to the heat dissipation effect or light utilization efficiency.

The present invention was made in consideration of the above-described issues, and an object thereof is to provide a substrate for a light emitting device, where a high heat dissipation effect and a high light utilization efficiency can be realized, a light emitting device including the substrate for a light emitting device, and a method for manufacturing the substrate for a light emitting device.

Solution to Problem

In order to solve the issues, a substrate for a light emitting device, according to an aspect of the present invention, includes a metal substrate portion having at least a metal substrate, a first insulating layer which is disposed on the metal substrate portion and which has thermal conductivity, a wiring pattern disposed on the first insulating layer, and a second insulating layer which is disposed on the first insulating layer and the wiring pattern and which has light reflectivity.

Also, in order to solve the issues, a substrate for a light emitting device, according to an aspect of the present invention, includes a metal substrate portion having at least a metal substrate, an insulating layer which is disposed on the metal substrate portion and which has thermal conductivity and light reflectivity, and a wiring pattern embedded inside the insulating layer.

Also, in order to solve the issues, a light emitting device according to an aspect of the present invention includes the substrate for a light emitting device and a light emitting element which is disposed on the second insulating layer of the substrate for a light emitting device and which is electrically connected to the wiring pattern.

Also, in order to solve the issues, a light emitting device according to an aspect of the present invention includes the substrate for a light emitting device and a light emitting element which is disposed on the insulating layer of the substrate for a light emitting device and which is electrically connected to the wiring pattern.

Also, in order to solve the issues, a method for manufacturing a substrate for a light emitting device, according to an aspect of the present invention, includes the steps of producing a metal substrate portion by forming an anodized aluminum protective layer on a substrate composed of aluminum by performing an anodization treatment, forming an electrically conductive layer and a first insulating layer by attaching a composite sheet to the metal substrate portion, where the composite sheet is obtained by attaching a sheet-shaped epoxy resin that contains ceramic particles so as to have enhanced thermal conductivity to a metal sheet composed of copper, forming a wiring pattern from the electrically conductive layer by etching, forming a second insulating layer, which has thermal conductivity lower than the thermal conductivity of the first insulating layer and which has light reflectivity higher than the light reflectivity of the first insulating layer, on the first insulating layer and the wiring pattern by coating and, in addition, exposing an electrode terminal portion of the wiring pattern to be electrically connected to an electrode of the light emitting element, and coating the electrode terminal portion by metal plating.

Advantageous Effects of Invention

According to the aspects of the present invention, there are advantageous effects that a high heat dissipation effect and a high light utilization efficiency can be realized.

DESCRIPTION OF EMBODIMENTS

[First Embodiment]

An embodiment according to the present invention will be described.

Figure 1:
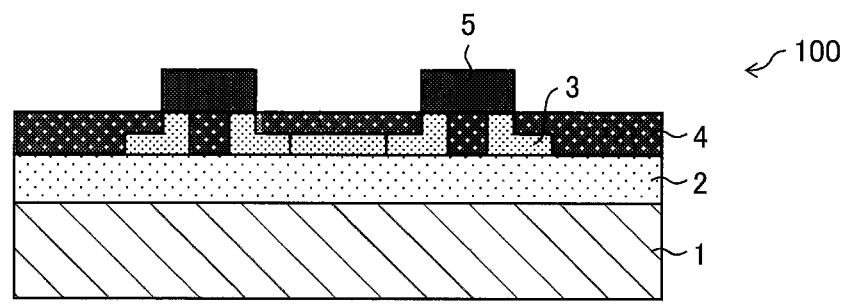
FIG. 1 is a schematic sectional view showing the configuration of a light emitting device according to an embodiment of the present invention.

FIG. 1 is a schematic sectional view showing the configuration of a light emitting device according to the present embodiment.

A light emitting device 100 shown in FIG. 1 includes an aluminum substrate 1, a high heat dissipation ceramic layer 2, an etching frame 3, a highly reflective ceramic layer 4, and LED chips 5. The aluminum substrate 1, the high heat dissipation ceramic layer 2, the etching frame 3, and the highly reflective ceramic layer 4 constitute a substrate for a light emitting device.

The aluminum substrate (metal substrate portion) 1 is a substrate having high thermal conductivity. A copper substrate having high thermal conductivity likewise may be used instead of the aluminum substrate 1. In this regard, the aluminum substrate 1 has advantages of a low price, ease of processing, and high resistance to atmospheric humidity. The exterior shape of the aluminum substrate 1 is not specifically limited.

The high heat dissipation ceramic layer (first insulating layer) 2 is disposed on the aluminum substrate 1. It can be said that the high heat dissipation ceramic layer 2 is disposed on one surface side of the aluminum substrate 1. The high heat dissipation ceramic layer 2 is formed by drying and firing a high heat dissipation ceramic paint 12 (refer to FIG. 2) applied to the aluminum substrate 1 by a printing method. The high heat dissipation ceramic layer 2 has an electrically insulating property and high thermal conductivity and may have high light reflectivity. Specific examples of the high heat dissipation ceramic paint 12 include aluminum nitride ceramic paints, alumina ceramic paints, and zirconia ceramic paints, but are not limited to these as long as the electrically insulating property and the high thermal conductivity are provided. Also, glass raw materials having a siloxane bond for synthesizing glass by a sol-gel method or the like are used, or resin raw materials as the raw material for a binder to be mixed into these paints are used.

The etching frame (wiring pattern) 3 (refer to FIG. 3) is a wiring pattern produced by, for example, etching a thin plate composed of copper. The etching frame 3 is disposed on the high heat dissipation ceramic layer 2.

The highly reflective ceramic layer (second insulating layer) 4 is disposed on the high heat dissipation ceramic layer 2 and the etching frame 3. The highly reflective ceramic layer 4 is formed by drying and firing a highly reflective ceramic paint 14 (refer to FIG. 4) applied to the high heat dissipation ceramic layer 2 and the etching frame 3 by a printing method (refer to FIG. 5). The highly reflective ceramic layer 4 has an electrically insulating property and high light reflectivity. Specific examples of the highly reflective ceramic paint 14 include zirconia ceramic paints, but are not specifically limited to these as long as the electrically insulating property and the high light reflectivity are provided.

The binder of the highly reflective ceramic layer 4 may be a glass binder having a siloxane bond synthesized by a sol-gel method or a resin. The drying temperature and the firing temperature of the highly reflective ceramic layer 4 are preferably lower than the drying temperature and the firing temperature of the high heat dissipation ceramic layer 2.

In particular, attention should be given in the case where the resin binder is used for the high heat dissipation ceramic layer 2 and the glass binder synthesized by the sol-gel method is used for the highly reflective ceramic layer 4. The glass binder synthesized by the sol-gel method is dried and fired usually at high temperatures of 250° C. to 500° C. On the other hand, the curing temperatures and the heat resistant temperatures of thermosetting resins are usually 200° C. or lower. Therefore, in the case where the resin binder is used for the high heat dissipation ceramic layer 2, attention should be given to the heat resistance thereof.

Consequently, in the case where the resin binder is used for the high heat dissipation ceramic layer 2, it is preferable to use the resin binder for the highly reflective ceramic layer 4 rather than the glass binder that requires a high firing temperature for the highly reflective ceramic layer 4.

The LED chip (light emitting element) 5 is in the form of a package and is electrically connected to the etching frame 3 by flip chip bonding. FIG. 1 shows two LED chips 5, although the number of the LED chips 5 is not limited to this.

FIG. 2 to FIG. 6 are sectional views showing a method for manufacturing the light emitting device 100.

Figure 2:
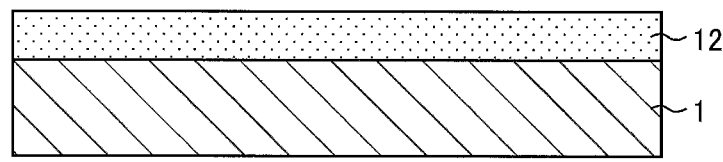
FIG. 2 is a sectional view showing the method for manufacturing the light emitting device shown in FIG. 1 and showing a step of formation of a high heat dissipation ceramic layer on an aluminum substrate.

In a first step, as shown in FIG. 2, the aluminum substrate 1 is printed with the high heat dissipation ceramic paint 12, and the high heat dissipation ceramic layer 2 is formed by performing drying and firing.

Here, the thickness of the high heat dissipation ceramic layer 2 is preferably 25 µm or more and 150 µm or less. Consequently, an occurrence of cracking in the high heat dissipation ceramic layer 2 is suppressed and, in addition, the aluminum substrate 1 can be reliably insulated from the etching frame 3.

Figure 3:
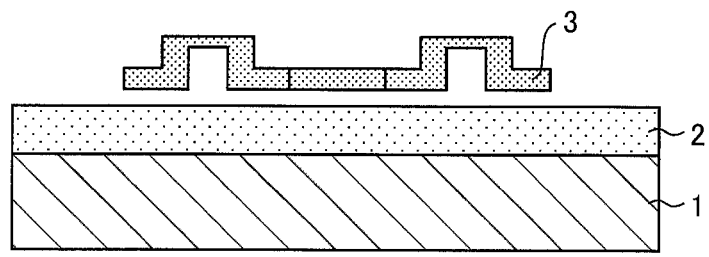
FIG. 3 is a sectional view showing the method for manufacturing the light emitting device shown in FIG. 1 and showing a step of attaching of an etching frame on the high heat dissipation ceramic layer.

In a second step, as shown in FIG. 3, the etching frame 3 is attached to the high heat dissipation ceramic layer 2.

Figure 4:
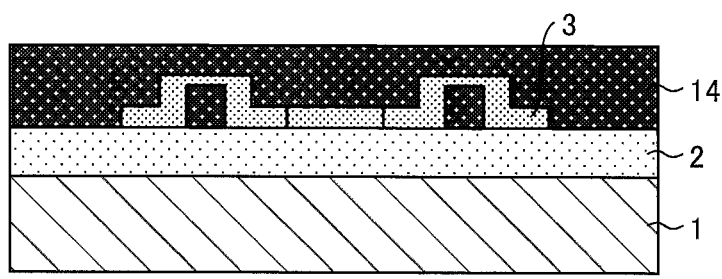
FIG. 4 is a sectional view showing the method for manufacturing the light emitting device shown in FIG. 1 and showing a step of formation of a highly reflective ceramic layer on the high heat dissipation ceramic layer and the etching frame.

In a third step, as shown in FIG. 4, the high heat dissipation ceramic layer 2 and the etching frame 3 are printed with the highly reflective ceramic paint 14, and the highly reflective ceramic layer 4 is formed by performing drying and firing.

Figure 5:
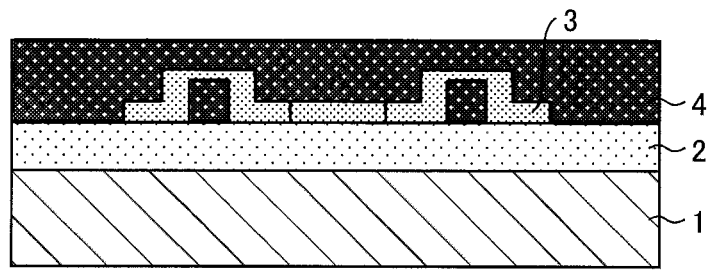
FIG. 5 is a sectional view showing the method for manufacturing the light emitting device shown in FIG. 1 and showing a step just before polishing of the surface of the highly reflective ceramic layer.
Figure 6:
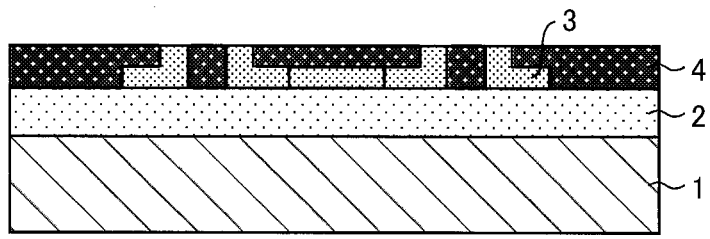
FIG. 6 is a sectional view showing the method for manufacturing the light emitting device shown in FIG. 1 and showing the state when the polishing is completed.

In a fourth step, the surface of the highly reflective ceramic layer 4 shown in FIG. 5 is polished. FIG. 6 shows the state when the polishing is completed. At the point in time when the polishing is completed, the portion (electrode terminal portion) to be connected to the LED chips 5 of the etching frame 3 is exposed. In addition, the electrode terminal portion is divided.

Here, the thickness of the highly reflective ceramic layer 4 is preferably 20 µm or more and 150 µm or less. Consequently, sufficient electrically insulating property and light reflectivity can be realized.

In a final step, as shown in FIG. 1, the LED chips 5 are electrically connected to the etching frame 3 by flip chip bonding.

Consequently, the area of a light emitting portion in the light emitting device 100 can be reduced. In addition, the light emitting portion and the reflector can be disposed close to each other. As a result, the optical coupling efficiency with the reflector can be improved. Also, the LED chip 5 can be integrated, and the diameter of the light emitting portion can be reduced (for example, from 47 mm to 27 mm) by the integration. As a result, the output can be increased and the diameter of the optical spot can be reduced, so that the light emitting device 100 most suitable for a spotlight can be realized.

In the light emitting device 100, the etching frame 3 is formed directly on the high heat dissipation ceramic layer 2. Consequently, the heat generated in the LED chips 5 and the like can be dissipated through the etching frame 3 and the high heat dissipation ceramic layer 2 to the aluminum substrate 1 efficiently.

It is preferable that the value of the area of the base of the etching frame 3 (the area of the portion where the etching frame 3 is in contact with the high heat dissipation ceramic layer 2; refer to FIG. 1) divided by the total number of the LED chips 5 be made sufficiently large compared with the area of the base of the electrodes of the LED chips 5. Consequently, the heat generated in the LED chips 5 can be dissipated through the etching frame 3 and the high heat dissipation ceramic layer 2 to the aluminum substrate 1 more efficiently. This is because the etching frame 3 according to the present embodiment is formed from, for example, copper, and the thermal conductivity is still higher than the thermal conductivity of the high heat dissipation ceramic layer 2. The heat is sufficiently diffused in the etching frame 3 in contact with the electrodes of the LED chips 5 and, then, the heat flows through the high heat dissipation ceramic layer 2 to the aluminum substrate 1, so that the thermal resistance to the heat passing through the high heat dissipation ceramic layer 2 can be reduced.

More specifically, in the case where the value of the area of the base of the etching frame 3 divided by the total number of the LED chips 5 is at least 5 times the area of the base of the electrode of an LED chip 5, a highly efficient heat dissipation effect is clearly ascertained. In other words, it is preferable that the total area of the base of the wiring pattern composed of the etching frame 3 be at least 5 times (5 or more times) the total area of the base of rear electrodes of all LED chips 5 mounted on the light emitting device 100 by flip chip bonding. Consequently, it can be said that the heat can be dissipated through the high heat dissipation ceramic layer 2 to the aluminum substrate 1 efficiently.

In addition, in the light emitting device 100, the highly reflective ceramic layer 4 is disposed on the high heat dissipation ceramic layer 2 and the etching frame 3. Consequently, the light utilization efficiency can be improved.

In the present embodiment, the example in which the high heat dissipation ceramic layer 2 and the highly reflective ceramic layer 4 are formed by the printing method is shown. However, the high heat dissipation ceramic layer 2 and the highly reflective ceramic layer 4 may be formed by performing coating by a spraying method instead of the printing method and performing drying and firing.

[Second Embodiment]

Another embodiment according to the present invention will be described.

Figure 7:
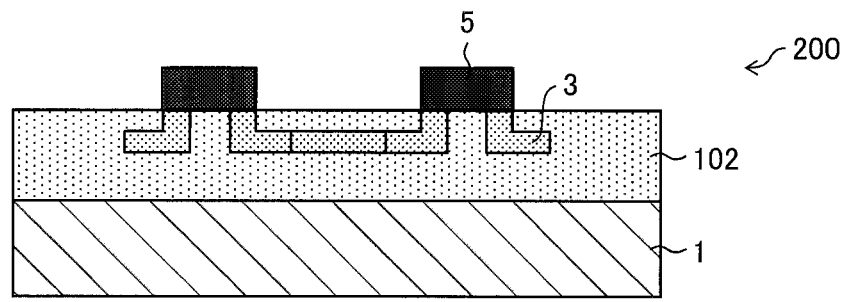
FIG. 7 is a schematic sectional view showing the configuration of a light emitting device according to another embodiment of the present invention.

FIG. 7 is a schematic sectional view showing the configuration of a light emitting device according to the present embodiment.

A light emitting device 200 shown in FIG. 7 includes an aluminum substrate 1, a PFA sheet 102, an etching frame 3, and LED chips 5. That is, in comparison with the light emitting device 100, the light emitting device 200 includes the PFA sheet 102 instead of the high heat dissipation ceramic layer 2 and the highly reflective ceramic layer 4. The aluminum substrate 1, the PFA sheet 102, and the etching frame 3 constitute the substrate for a light emitting device.

The aluminum substrate 1, the etching frame 3, and the LED chip 5 are the same as those in the light emitting device 100 shown in FIG. 1.

However, in the light emitting device 200, the etching frame 3 is embedded inside the PFA sheet 102 because the PFA sheet 102 is included instead of the high heat dissipation ceramic layer 2 and the highly reflective ceramic layer 4.

The PFA sheet (insulating layer) 102 is disposed on the aluminum substrate 1. It can be said that the PFA sheet 102 is disposed on one surface side of the aluminum substrate 1. The PFA sheet 102 is a sheet composed of a tetrafluoroethylene resin called tetrafluoroethylene-perfluoroalkyl vinyl ether copolymer (PFA). The PFA sheet 102 has heat resistance, chemical resistance, non-adhesion, self-lubricity, and the like. Also, the PFA sheet 102 has an electrically insulating property, high thermal conductivity, and light reflectivity.

FIG. 8 to FIG. 11 are sectional views showing a method for manufacturing the light emitting device 200.

Figure 8:
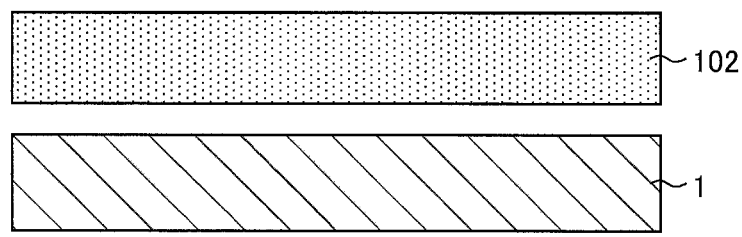
FIG. 8 is a sectional view showing a method for manufacturing the light emitting device shown in FIG. 7 and showing a step of provision of a PFA (tetrafluoroethylene-perfluoroalkyl vinyl ether copolymer) sheet on an aluminum substrate.

In a first step, as shown in FIG. 8, the aluminum substrate 1 and the PFA sheet 102 prepared separately are compressed at a high temperature (high temperature pressing) and, thereby, the PFA sheet 102 is disposed on the aluminum substrate 1. A high temperature of 300° C. or higher is required for fusing the PFA sheet 102 to the aluminum substrate 1.

The thermal conductivity and the light reflectivity of PFA used here can be improved by mixing ceramic particles which are insulators having excellent thermal conductivity and light reflectivity, where the thermal conductivity and the light reflectivity of PFA are low if PFA is not processed. Examples of typical ceramic materials used for such a purpose include alumina, titanium oxide, zirconia, and aluminum nitride. Examples of typical ceramics having high light reflectivity include alumina, titanium oxide, and zirconia. Examples of typical ceramics having high thermal conductivity include aluminum nitride and alumina. In order to provide the thermal conductivity and the light reflectivity to the PFA sheet 102 at the same time, for example, alumina and titanium oxide serving as ceramic particles may be mixed to PFA at the same time. The combination of the ceramic particles is not limited to this and the combination can be optionally determined in accordance with the purpose.

Figure 9:
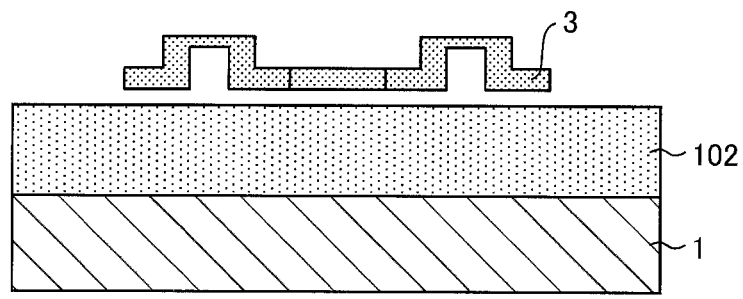
FIG. 9 is a sectional view showing the method for manufacturing the light emitting device shown in FIG. 7 and showing a step of preparation of an etching frame.

In a second step, as shown in FIG. 9, the etching frame 3 is prepared. At this point in time, the etching frame 3 should not be installed on the PFA sheet 102.

Figure 10:
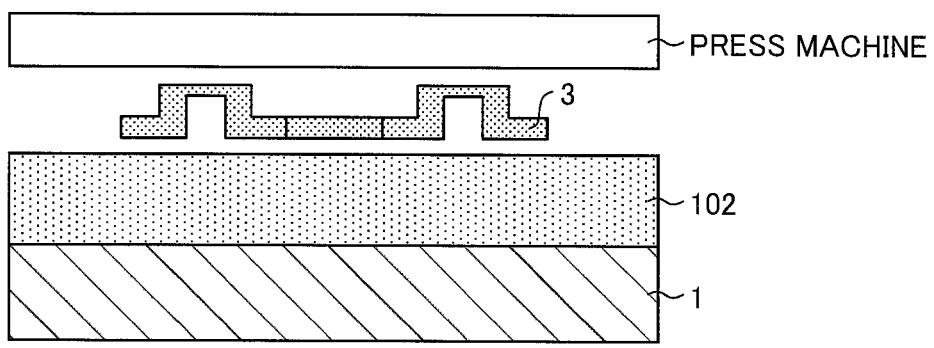
FIG. 10 is a sectional view showing the method for manufacturing the light emitting device shown in FIG. 7 and showing a step of high temperature pressing of the etching frame against the PFA sheet.
Figure 11:
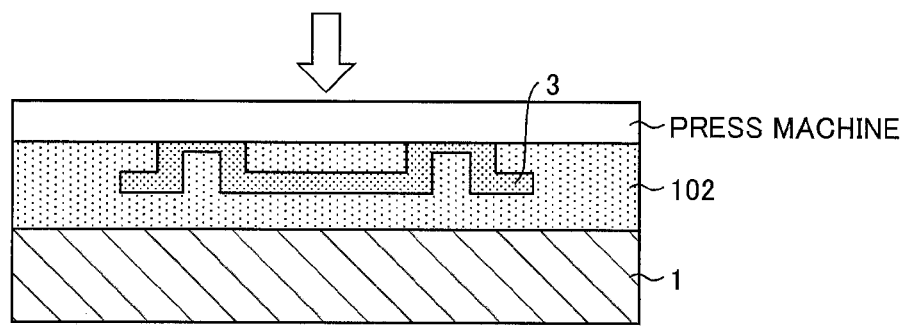
FIG. 11 is a sectional view showing the method for manufacturing the light emitting device shown in FIG. 7 and showing the state in the middle of the high temperature pressing shown in FIG. 10.

In a third step, as shown in FIG. 10, the etching frame 3 is pressed against the PFA sheet 102 at a high temperature from above the PFA sheet 102. FIG. 11 shows the state in the middle of the high temperature pressing. The high temperature pressing is performed at a temperature of, for example, 350° C. When the high temperature pressing is completed, the etching frame 3 is embedded inside the PFA sheet 102. At the point in time when the high temperature pressing is completed, the portions to be connected to the LED chips 5 of the etching frame 3 are exposed. In this regard, individual portions to be connected are joined with each other. The individual portions to be connected can be electrically separated from each other so as to form the wiring pattern by, for example, polishing the upper layer portion of the PFA sheet 102 together with the individual portions to be connected.

Here, the thickness of the PFA sheet 102 is preferably 70 μm or more and 300 μm or less. Consequently, sufficient electrically insulating property, thermal conductivity, and light reflectivity can be realized.

In a final step, as shown in FIG. 7, the LED chips 5 are electrically connected to the etching frame 3 by flip chip bonding.

The portions to be connected to the LED chips 5 of the etching frame 3 may be coated with plating in accordance with the purpose. For example, in the case where flip chip bonding is performed by using AuSn eutectic solder, the portion to be connected is preferably coated with plating of Ni/Pd/Au and the like. The PFA sheet 102 covering the etching frame 3 has high chemical resistance and, therefore, is not corroded by a plating solution. The plating is not deposited on the portion of the etching frame 3 other than the portions to be connected, so that man-hours can be reduced.

In the light emitting device 200, the etching frame 3 is embedded inside the PFA sheet 102. Consequently, the heat generated in the LED chips 5 and the like can be dissipated through the etching frame 3 and the PFA sheet 102 to the aluminum substrate 1 efficiently.

In addition, in the light emitting device 200, the etching frame 3 is embedded inside the PFA sheet 102. Consequently, the light utilization efficiency can be improved.

In this regard, the aluminum substrate 1 in each of the above-described embodiments may be composed of aluminum or contain aluminum as a primary component and other materials. That is, it is sufficient for the aluminum substrate 1 that the primary component of the material constituting the aluminum substrate 1 is aluminum.

Also, in the light emitting device 200, the insulating layer is only a layer of PFA sheet 102, so that the man-hours for disposing the insulating layer can be reduced.

[Third Embodiment]

Another embodiment according to the present invention will be described.

Figure 12:
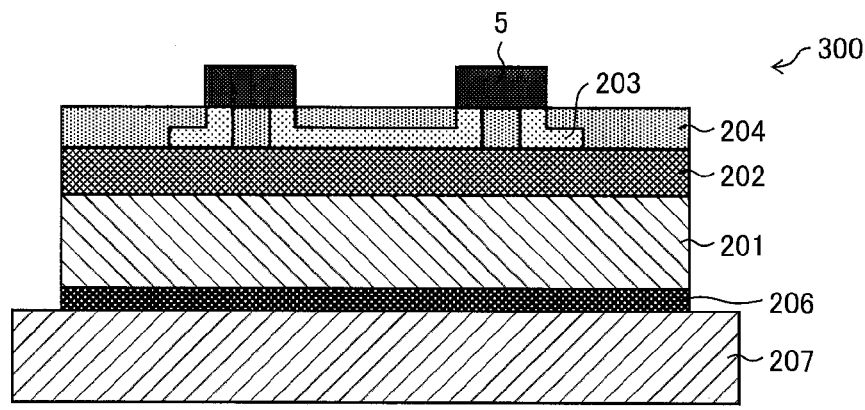
FIG. 12 is a schematic sectional view showing the configuration of a light emitting device according to another embodiment of the present invention.

FIG. 12 is a schematic sectional view showing the configuration of a light emitting device according to the present embodiment.

A light emitting device 300 shown in FIG. 12 includes a copper substrate 201, a PTFE sheet 202, an etching frame 203, an inorganic resist layer 204, LED chips 5, an adhesive 206, and a heatsink 207. The copper substrate 201, the PTFE sheet 202, the etching frame 203, and the inorganic resist layer 204 constitute the substrate for a light emitting device.

The copper substrate (metal substrate portion) 201 is a flexible substrate having high thermal conductivity. An aluminum substrate having high thermal conductivity likewise may be used instead of the copper substrate 201. The exterior shape of the copper substrate 201 is not specifically limited.

The PTFE sheet (first insulating layer) 202 is disposed on the copper substrate 201. It can be said that the PTFE sheet 202 is disposed on one surface side of the copper substrate 201. The PTFE sheet 202 is a sheet composed of a fluororesin (PTFE), which is called polytetrafluoroethylene, obtained by bonding of a fluororesin raw material. The PTFE sheet 202 has an electrically insulating property and high thermal conductivity because ceramic particles having an electrically insulating property and high thermal conductivity are added appropriately.

The etching frame (wiring pattern) 203 is a wiring pattern produced by, for example, etching a thin plate composed of copper (refer to copper plate 213 described later). The etching frame 203 is disposed on the PTFE sheet 202.

The inorganic resist layer (second insulating layer) 204 is disposed on the PTFE sheet 202 and the etching frame 203. The inorganic resist layer 204 is formed from an inorganic resist paint (paint containing an inorganic matter as a binder) applied to the PTFE sheet 202 and the etching frame 203. The inorganic resist layer 204 has an electrically insulating property and high light reflectivity. As an example, a light reflective layer can be formed as the inorganic resist layer 204, where a silicone resin is used as a binder and ceramic particles of alumina or titanium oxide are mixed. As a matter of course, a plurality of different types of ceramic particles of alumina, titanium oxide, and the like may be mixed into the silicone resin at the same time and, subsequently, the light reflective layer may be formed.

The LED chips 5 are electrically connected to the etching frame 203 and are the same as the LED chips 5 in the light emitting device 100 and 200.

The adhesive 206 bonds the copper substrate 201 to the heatsink 207. An adhesive having a high heat dissipation effect is used as the adhesive 206. A heat dissipation grease may be used instead of the adhesive 206.

The heatsink 207 is a heat dissipation device for absorbing the heat generated in the light emitting device 300 and dissipating the heat to the outside of the light emitting device 300. It can be said that the heatsink 207 is disposed on the other surface side of the copper substrate 201.

In this regard, in the light emitting devices 100 and 200, the aluminum substrate 1 may be bonded to the heatsink 207 by the adhesive 206 or the heat dissipation grease, as in the light emitting device 300.

FIG. 13 to FIG. 17 are sectional views showing a method for manufacturing the light emitting device 300.

Figure 13:
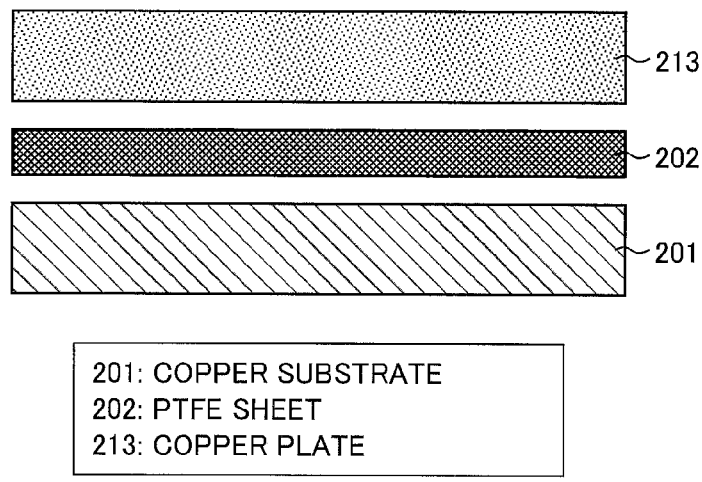
FIG. 13 is a sectional view showing the method for manufacturing the light emitting device shown in FIG. 12 and showing a step of fusing of a PTFE (polytetrafluoroethylene) sheet, a copper substrate, and a copper plate.
Figure 14:
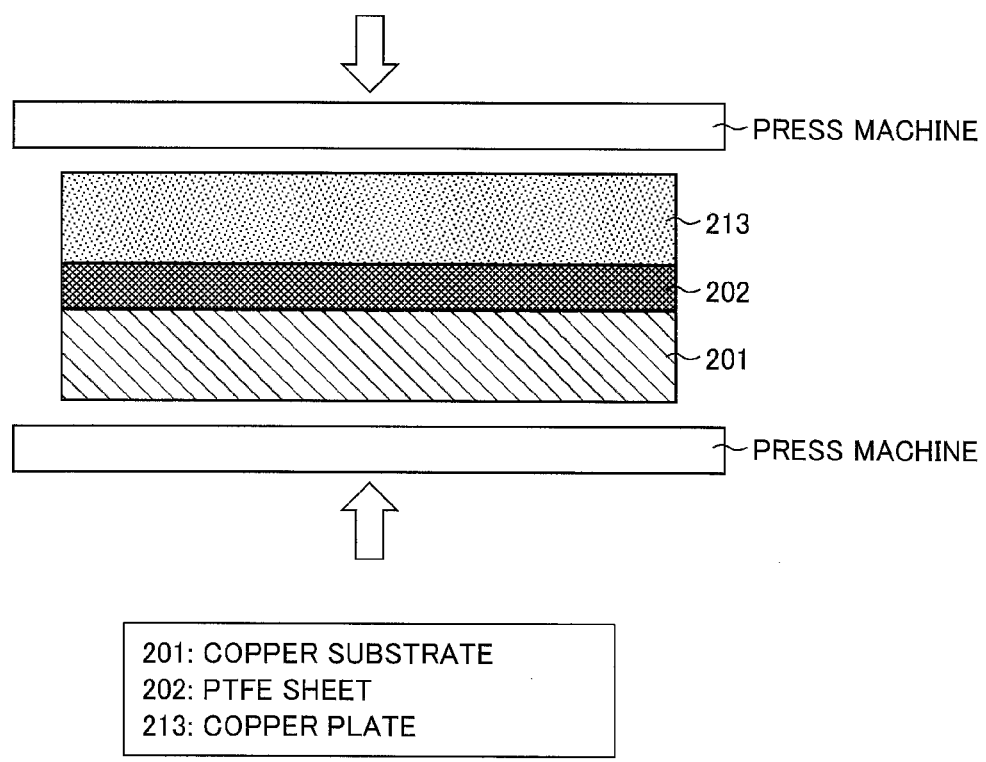
FIG. 14 is a sectional view showing the method for manufacturing the light emitting device shown in FIG. 12 and showing the state in the middle of the fusing shown in FIG. 13.

In a first step, as shown in FIG. 13, the PTFE sheet 202 is sandwiched between the copper substrate 201 and the copper plate 213, and the PTFE sheet 202 is fused to the copper substrate 201 and the copper plate 213. A high temperature of 300° C. or higher is required for fusing the PTFE sheet 202 to the copper substrate 201 and the copper plate 213. FIG. 14 shows the state in the middle of the fusing.

In order to enhance the adhesion strength between the PTFE sheet 202 and the copper substrate 201 and between the PTFE sheet 202 and the copper plate 213, preferably, the surfaces, which come into contact with the PTFE sheet 202, of the copper substrate 201 and the copper plate 213 are roughened before fusion by a blast treatment or the like.

Here, the thickness of the PTFE sheet 202 is preferably 25 μm or more and 150 μm or less.

The thermal conductivity of PTFE used here may be improved by mixing ceramic particles which are insulators having excellent thermal conductivity, where the thermal conductivity of PTFE is low if PTFE is not processed. For such a purpose, for example, the PTFE sheet 202 having high thermal conductivity is obtained by mixing aluminum nitride or alumina into PTFE and performing processing into the shape of a sheet.

Figure 15:
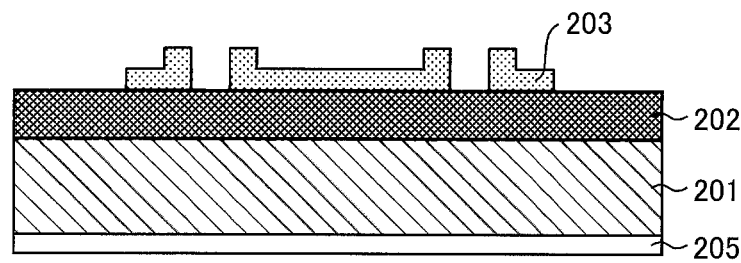
FIG. 15 is a sectional view showing the method for manufacturing the light emitting device shown in FIG. 12 and showing a step of formation of an etching frame by etching the copper plate.

In a second step, as shown in FIG. 15, the copper plate 213 is etched so as to form the etching frame 203. Consequently, the etching frame 203 is formed on the PTFE sheet 202. The PTFE sheet 202 has high chemical resistance. Therefore, when the copper plate 213 is etched, only the copper substrate 201 may be covered with a chemical-resistant protective sheet 205.

Figure 16:
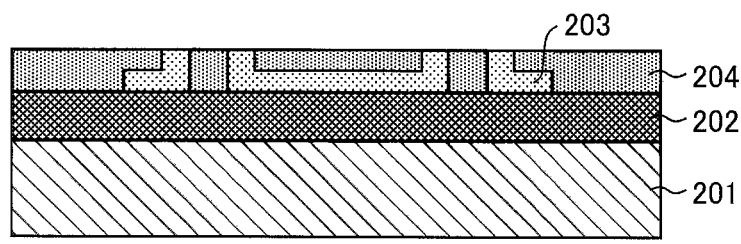
FIG. 16 is a sectional view showing the method for manufacturing the light emitting device shown in FIG. 12 and showing a step of formation of an inorganic resist layer on the PTFE sheet and the etching frame.

In a third step, as shown in FIG. 16, the PTFE sheet 202 and the etching frame 203 are coated with an inorganic resist paint, and the inorganic resist layer 204 is formed by performing drying and firing. At this point in time, the portions (electrode terminal portions) to be connected to the LED chips 5 of the etching frame 203 are left covered with the inorganic resist layer 204. The inorganic resist layer 204 covering the electrode terminal portions is removed by polishing so as to expose the electrode terminal portions.

Here, the thickness of the inorganic resist layer 204 is preferably 20 μm or more and 150 μm or less. Consequently, sufficient electrically insulating property and light reflectivity can be realized.

Figure 17:
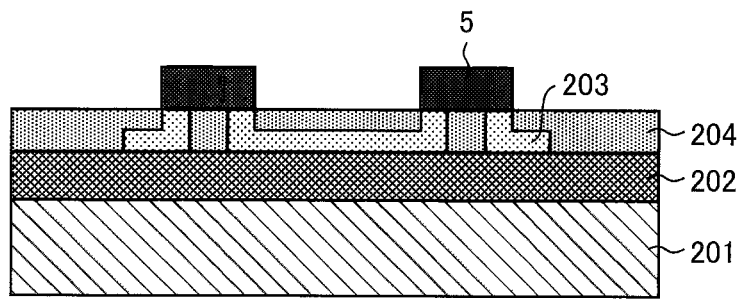
FIG. 17 is a sectional view showing the method for manufacturing the light emitting device shown in FIG. 12 and showing a step of electrical connection of an LED chip to the etching frame.

In a fourth step, as shown in FIG. 17, the LED chips 5 are electrically connected to the etching frame 203 by flip chip bonding.

The portions to be connected to the LED chips 5 of the etching frame 203 may be coated with plating in accordance with the same purpose as in the second embodiment. The PTFE sheet 202 and the inorganic resist layer 204 covering the etching frame 203 have excellent chemical resistance. Therefore, neither the first insulating layer (PTFE sheet 202) nor the second insulating layer (inorganic resist layer 204) is corroded by a plating solution. The plating is not deposited on the portion of the etching frame 203 other than the portions to be connected, so that man-hours can be reduced.

In a final step, as shown in FIG. 12, the copper substrate 201 is bonded to the heatsink 207 by the adhesive 206. The heatsink 207 is disposed on the surface opposite to the surface to be provided with the PTFE sheet 202 and the like of the copper substrate 201.

In the light emitting device 300, the etching frame 203 is formed directly on the PTFE sheet 202. Consequently, the heat generated in the LED chips 5 and the like can be dissipated through the etching frame 203, the PTFE sheet 202, the copper substrate 201, and the adhesive 206 to the heatsink 207 efficiently.

As is described in the first embodiment above, the heat can be dissipated efficiently by sufficiently increasing the value of the area of the base of the etching frame 203 (area of the portion where the etching frame 203 is in contact with the PTFE sheet 202; refer to FIG. 12) compared with the area of the base of the electrodes of the LED chips 5. According to such a structure, the heat generated in the LED chips 5 is sufficiently diffused in the etching frame 203 in contact with the electrodes of the LED chips 5 and, then, the heat can flow through the PTFE sheet 202 to the copper substrate 201. Consequently, even in the case where the thermal conductivity of the PTFE sheet 202 is lower than the thermal conductivity of the etching frame 203, the thermal resistance to the heat passing through the PTFE sheet 202 can be reduced, so that the heat can be dissipated efficiently. In practice, in the present embodiment, the etching frame 203 is composed of copper and, therefore, the thermal conductivity of the PTFE sheet 202 is lower than the thermal conductivity of the etching frame 203.

For the same reason as in the first embodiment, it is preferable that the total area of the base of the wiring pattern composed of the etching frame 203 be at least 5 times (5 or more times) the total area of the base of rear electrodes of all LED chips 5 mounted on the light emitting device 300 by flip chip bonding. Consequently, it can be said that the heat can be dissipated through the PTFE sheet 202 to the copper substrate 201 efficiently.

In addition, in the light emitting device 300, the inorganic resist layer 204 is disposed on the PTFE sheet 202 and the etching frame 203. Consequently, the light utilization efficiency can be improved.

In this regard, the copper substrate 201 according to the above-described embodiment may be composed of copper or contain copper as a primary component and other materials. That is, it is sufficient for the copper substrate 201 that the primary component of the material constituting the copper substrate 201 is copper.

An inorganic resist layer in which, for example, white ceramics, e.g., titanium oxide or alumina, is mixed into a silicone resin may be used as the inorganic resist layer 204. As a matter of course, a plurality of different types of ceramic particles of alumina, titanium oxide, and the like may be mixed into the silicone resin at the same time and, subsequently, the light reflective layer may be formed.

Also, the highly reflective ceramic layer 4 may be used instead of the inorganic resist layer 204.

[Fourth Embodiment]

Another embodiment according to the present invention will be described.

Figure 25:
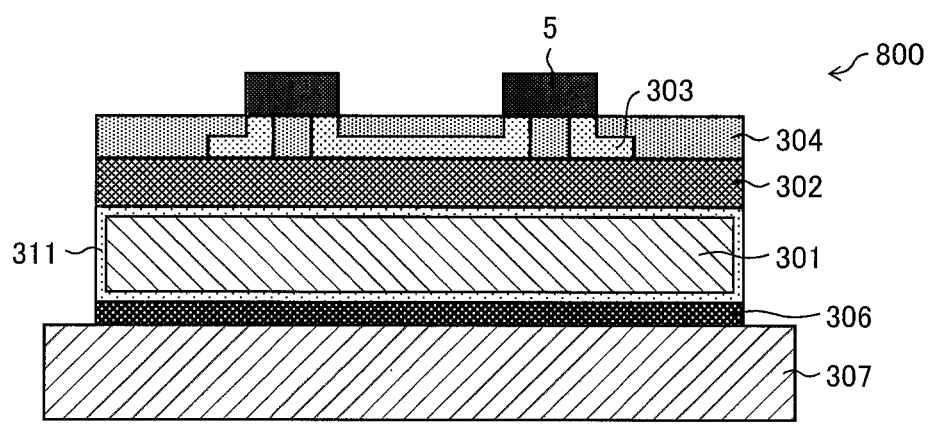
FIG. 25 is a schematic sectional view showing the configuration of a light emitting device according to another embodiment of the present invention.

FIG. 25 is a schematic sectional view showing the configuration of a light emitting device according to the present embodiment.

A light emitting device 800 shown in FIG. 25 includes an aluminum substrate 301, an anodized aluminum protective layer 311, an epoxy resin sheet 302, an etching frame 303, an inorganic resist layer 304, LED chips 5, a heat dissipation grease 306, and a heatsink 307. The aluminum substrate 301, the anodized aluminum protective layer 311, the epoxy resin sheet 302, the etching frame 303, and the inorganic resist layer 304 constitute the substrate for a light emitting device.

In the light emitting device 800, all surfaces of the aluminum substrate 301 are entirely covered with the anodized aluminum protective layer 311. The anodized aluminum protective layer 311 subjected to a sealing treatment has not only excellent weatherability and environmental resistance but also excellent chemical resistance. Consequently, the anodized aluminum protective layer 311 not only functions as a protective layer of a finished product but also prevents corrosion of the aluminum substrate 301 by an etching solution or a plating solution that has acidity or alkalinity in the production step of the light emitting device 800.

The exterior shape of the aluminum substrate 301 is not specifically limited.

The epoxy resin sheet (first insulating layer) 302 may be formed directly on the aluminum substrate 301. However, it is preferable from the viewpoint of the convenience of the production process to subject the aluminum substrate 301 to an anodization treatment in such a way that all surfaces of the aluminum substrate 301 are entirely covered with the anodized aluminum protective layer 311 and attach the epoxy resin sheet 302 to the anodized aluminum protective layer 311.

It can be said that the epoxy resin sheet 302 is disposed on one surface side of the aluminum substrate 301.

The epoxy resin essentially has a high electrically insulating property and low thermal conductivity, so that the heat dissipation effect is low if the epoxy resin is not processed. On the other hand, the epoxy resin sheet 302 having an electrically insulating property and high thermal conductivity is realized by mixing ceramic particles having a high electrically insulating property and thermal conductivity into the epoxy resin appropriately and performing processing into the shape of a sheet.

The etching frame (wiring pattern) 303 is a wiring pattern produced by, for example, etching a thin plate composed of copper (refer to copper plate 313 described later). The etching frame 303 is disposed on the epoxy resin sheet 302 having an electrically insulating property and high thermal conductivity.

The inorganic resist layer (second insulating layer) 304 is disposed on the epoxy resin sheet 302 and the etching frame 303. The inorganic resist layer 304 is formed from an inorganic resist paint (paint containing an inorganic matter as a binder) applied to the epoxy resin sheet 302 and the etching frame 303. The inorganic resist layer 304 has an electrically insulating property and high light reflectivity. As an example, a light reflective layer can be formed as the inorganic resist layer 304, where a silicone resin is used as a binder and ceramic particles of alumina or titanium oxide are mixed. As a matter of course, a plurality of different types of ceramic particles of alumina, titanium oxide, and the like may be mixed into the silicone resin at the same time and, subsequently, the light reflective layer may be formed.

The LED chips 5 are electrically connected to the etching frame 303 and are the same as the LED chips 5 in the light emitting device 100, 200, and 300.

The heat dissipation grease 306 thermally bonds the anodized aluminum protective layer 311 covering the aluminum substrate 301 to the heatsink 307.

The heatsink 307 is a heat dissipation member for absorbing the heat generated in the light emitting device 800 and dissipating the heat to the outside of the light emitting device 800. The heat dissipation effect of the heatsink 307, although not shown in the drawing, is usually enhanced by increasing the surface area by using a heat dissipation fin. It can be said that the heatsink 307 is disposed on the other surface side of the aluminum substrate 301.

FIG. 26 to FIG. 30 are sectional views showing a method for manufacturing the light emitting device 800.

Figure 26:
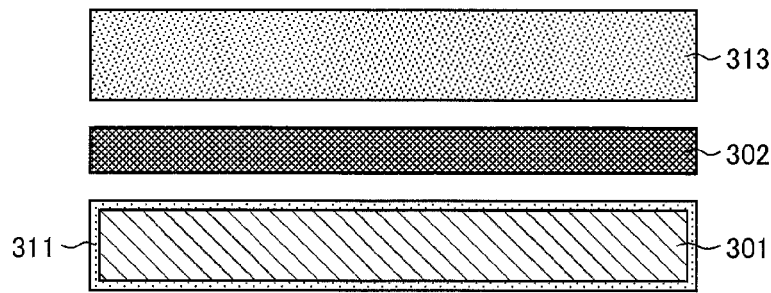
FIG. 26 is a sectional view showing a method for manufacturing the light emitting device shown in FIG. 25 and showing a step of sandwiching of an epoxy resin sheet before proceeding of a curing reaction between a copper plate and an aluminum substrate covered with an anodized aluminum protective layer.
Figure 27:
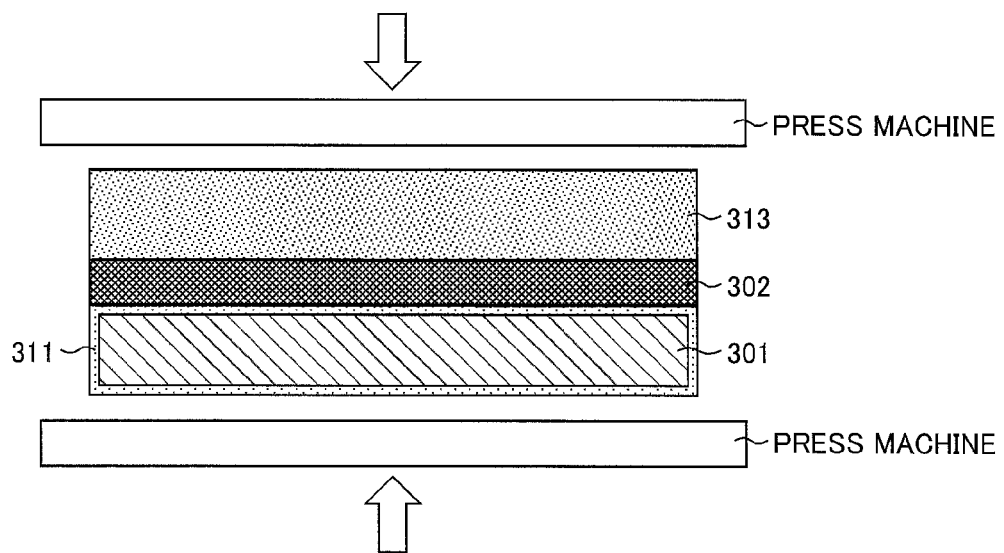
FIG. 27 is a sectional view showing the method for manufacturing the light emitting device shown in FIG. 25 and showing a step of bonding of the epoxy resin sheet to the copper plate and the aluminum substrate covered with the anodized aluminum protective layer.

In a first step, as shown in FIG. 26, the epoxy resin sheet 302 before proceeding of a curing reaction is sandwiched between the aluminum substrate 301 (metal substrate portion) and the copper plate 313 covered with the anodized aluminum protective layer 311, and the curing reaction of the resin is induced at a high temperature while a pressure is applied. Then, the epoxy resin sheet 302 is cured and, thereby, the epoxy resin sheet 302 is bonded to the copper plate 313 and the aluminum substrate 301 covered with the anodized aluminum protective layer 311. FIG. 27 shows the state in the middle of the bonding.

In order to enhance the adhesion strength between the epoxy resin sheet 302 and the copper plate 313, preferably, the surface, which comes into contact with the epoxy resin sheet 302, of the copper plate 313 is roughened by a blast treatment or the like before bonding.

Here, the thickness of the epoxy resin sheet 302 is preferably 25 µm or more and 150 µm or less.

In this regard, in order to enhance the adhesion strength between the aluminum substrate 301 and the copper plate 313, it is also preferable that the surface, which comes into contact with the epoxy resin sheet 302, of the aluminum substrate 301 be roughened by a blast treatment, a chemical treatment with an acid or an alkali, or the like before bonding. This method is effective as a technique to enhance the adhesion strength regardless of whether the surface of the aluminum substrate 301 is covered with the anodized aluminum protective layer 311 or not.

The thermal conductivity of the epoxy resin used for the epoxy resin sheet 302 is low if the epoxy resin is not processed. The thermal conductivity can be improved by mixing ceramic particles which are insulators having excellent thermal conductivity. For such a purpose, for example, the epoxy resin sheet 302 having high thermal conductivity before proceeding of a curing reaction is obtained by mixing ceramic particles, e.g., aluminum nitride or alumina, into the epoxy resin and performing processing into the shape of a sheet. This is pressed against the anodized aluminum protective layer 311 covering the aluminum substrate 301 and, in addition, a resin curing reaction is facilitated at a high temperature of about 180° C., so that the cured epoxy resin sheet 302 having high thermal conductivity is formed on the anodized aluminum protective layer 311.

In the present step, the epoxy resin sheet 302 is bonded to the anodized aluminum protective layer 311 and the copper plate 313 at the same time, although the attaching method is not limited to this. For example, a composite sheet may be prepared, in which the epoxy resin sheet 302 and the copper plate 313 are contact bonded in advance, and the resulting composite sheet may be attached to the anodized aluminum protective layer 311 by using a high temperature press machine. It is only needed that the layer structure shown in FIG. 27 can be finally formed.

Figure 28:
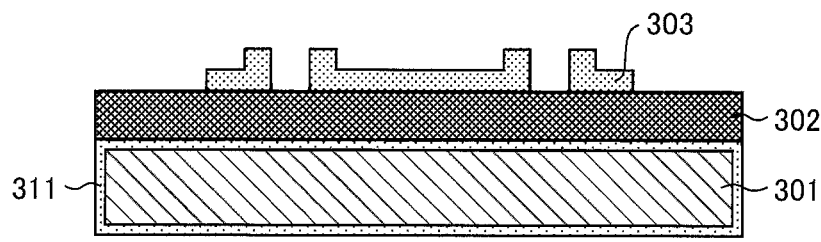
FIG. 28 is a sectional view showing the method for manufacturing the light emitting device shown in FIG. 25 and showing a step of formation of an etching frame by etching the copper plate.

In a second step, as shown in FIG. 28, the copper plate (electric conductor) 313 is etched so as to form the etching frame 303. Consequently, the etching frame 303 is formed on the epoxy resin sheet 302 having high thermal conductivity. The epoxy resin sheet 302 has high chemical resistance. Therefore, when the copper plate 313 is etched, the epoxy resin sheet 302 is not corroded by the etching solution.

The aluminum substrate 301 covered with the anodized aluminum protective layer 311 has high chemical resistance. Therefore, in contrast to the bare (without the anodized aluminum protective layer 311) aluminum substrate 1 or copper substrate 201, there is no need to be covered with a new chemical-resistant protective sheet.

An anodized aluminum protective film can be inexpensively easily formed on the surface of aluminum by subjecting aluminum to the anodization treatment and the sealing treatment. The protective film composed of anodized aluminum has excellent chemical resistance as described above and, therefore, functions as a protective film against an etching solution and a plating solution in the step of production of the light emitting device. Meanwhile, the protective film composed of anodized aluminum has excellent environmental resistance and weatherability and, therefore, also functions as a protective film in the light emitting device that is a finished product. Consequently, it is preferable that a material, in which the surface of aluminum is covered with anodized aluminum, be used as the material for the metal substrate portion.

Figure 29:
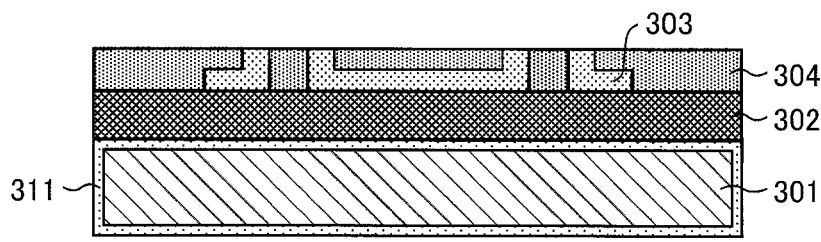
FIG. 29 is a sectional view showing the method for manufacturing the light emitting device shown in FIG. 25 and showing a step of formation of an inorganic resist layer on the epoxy resin sheet and the etching frame.

In a third step, as shown in FIG. 29, the epoxy resin sheet 302 and the etching frame 303 are coated with an inorganic resist paint, and the inorganic resist layer 304 is formed by performing drying and firing. At this point in time, the portions (electrode terminal portions) to be connected to the LED chips 5 of the etching frame 303 are left covered with the inorganic resist layer 304. The inorganic resist layer 304 covering the electrode terminal portions is removed by polishing so as to expose the electrode terminal portions.

Here, the thickness of the inorganic resist layer 304 is preferably 20 µm or more and 150 µm or less. Consequently, sufficient electrically insulating property and light reflectivity can be realized.

Figure 30:
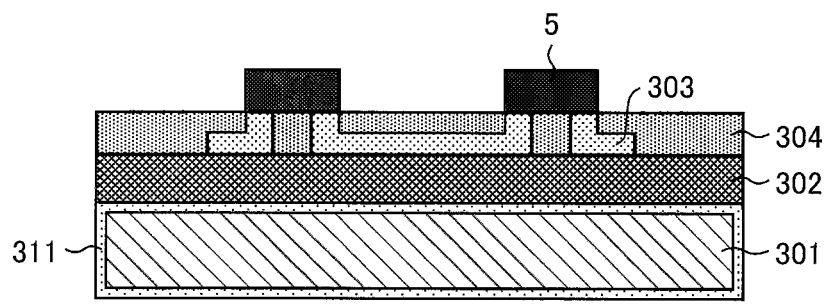
FIG. 30 is a sectional view showing the method for manufacturing the light emitting device shown in FIG. 25 and showing a step of electrical connection of an LED chip to the etching frame.

In a fourth step, as shown in FIG. 30, the LED chips 5 are electrically connected to the etching frame 303 by flip chip bonding.

At this time, the portions to be connected to the LED chips 5 of the etching frame 303 may be coated with plating in accordance with the same purpose as in the second and third embodiments. The epoxy resin sheet 302 and the inorganic resist layer 304 covering the etching frame 303 have excellent chemical resistance and, in addition, the aluminum substrate 301 is covered with the anodized aluminum protective layer 311. Consequently, neither the metal substrate portion, the first insulating layer, nor the second insulating layer is corroded by the plating solution. The plating is not deposited on the portion of the etching frame 303 other than the portions to be connected to the LED chips 5 (plating can be efficiently deposited on only the portion to be connected). Therefore, man-hours can be reduced.

In a final step, as shown in FIG. 25, the anodized aluminum protective layer 311 formed on the surface of the aluminum substrate 301 is bonded to the heatsink 307 by the heat dissipation grease 306. The heatsink 307 is disposed on the surface opposite to the surface to be provided with the epoxy resin sheet 302 and the like of the aluminum substrate 301.

In the light emitting device 800, the etching frame 303 is formed directly on the epoxy resin sheet 302. Consequently, the heat generated in the LED chips 5 and the like can be dissipated through the etching frame 303, the epoxy resin sheet 302, the anodized aluminum protective layer 311, the aluminum substrate 301, the anodized aluminum protective layer 311, and the heat dissipation grease 306 to the heatsink 307 efficiently.

In addition, in the light emitting device 800, the inorganic resist layer 304 is disposed on the epoxy resin sheet 302 and the etching frame 303. Consequently, the light utilization efficiency can be improved.

In this regard, the aluminum substrate 301 may be composed of aluminum or contain aluminum as a primary component and other materials. In short, it is sufficient for the aluminum substrate 301 that aluminum in an amount sufficient for forming the anodized aluminum protective layer 311 on the surface thereof is contained as a component of the material constituting the aluminum substrate 301.

An inorganic resist layer in which, for example, white ceramics, e.g., titanium oxide or alumina, is mixed into a silicone resin may be used as the inorganic resist layer 304. As a matter of course, a plurality of different types of ceramic particles of alumina, titanium oxide, and the like may be mixed into the silicone resin at the same time and, subsequently, the light reflective layer may be formed.

Also, the highly reflective ceramic layer 4 (refer to FIG. 1) may be used instead of the inorganic resist layer 304.

(Supplementation: Ceramics and Resin)

In the explanations of the present embodiment (fourth embodiment), the epoxy resin is used for the epoxy resin sheet 302 corresponding to the first insulating layer. Consequently, in the case where highly reflective ceramics is used for the inorganic resist layer 304, it is preferable to use the resin binder rather than the glass binder that requires a high firing temperature. As for the resin binder, a thermosetting resin having high heat resistance and chemical resistance is used because degradation with time or discoloration resulting from heat generation of a light source or strong light irradiation due to blue light and the like is prevented and, in addition, the resistance to acids and alkalis used for plating solutions and the like is exhibited. However, the resin binder is not limited to the thermosetting resins and may be thermoplastic resins and the like insofar as such characteristics are provided. Specific examples of resin materials include silicone resins, epoxy resins, polyimide resins, and fluororesins.

Regarding the binder composed of the thermosetting resin used for the inorganic resist layer 304 or the highly reflective ceramic layer 4 (refer to FIG. 1), the long-term reliability may be degraded compared with the glass binder, although curing is performed easily because curing proceeds at a relatively low temperature of 200° C. or lower. Consequently, damages to the aluminum substrate 301, the anodized aluminum protective layer 311, and the epoxy resin sheet 302 (first insulating layer) by the heat can be prevented and, in addition, the production cost can be reduced.

Also, in the case where the thermosetting resin is used for the inorganic resist layer 304 or the highly reflective ceramic layer 4 serving as the second insulating layer, as described above, the second insulating layer is formed at a relatively low temperature of 200° C. or lower, so that there is no need of concern about occurrence of cracking in the anodized aluminum protective layer 311. Therefore, the anodized aluminum protective layer 311 may be formed either before formation of the second insulating layer or after formation of the second insulating layer. As a result, the most convenient production step can be realized, wherein all surfaces of the aluminum substrate 301 are entirely covered with the anodized aluminum protective layer 311 in the first place.

Also, Typical examples of materials used as ceramics or ceramic particles, which are used for enhancing the thermal conductivity and the light reflectivity of the epoxy resin sheet 302 and the highly reflective ceramic layer 4, include alumina, zirconia, titanium oxide, and aluminum nitride. The ceramics here are not limited to metal oxides but refer to ceramics in a broad sense including aluminum nitride and the like, that is, inorganic solid materials in general.

Among these inorganic solid materials, any stable material having excellent heat resistance and light fastness and having excellent light diffusion and reflection characteristics as with alumina, zirconia, and titanium oxide may be employed as the ceramic particles used for the inorganic resist layer 304 or the highly reflective ceramic layer 4. In addition to those described above, examples of ceramic materials having high light reflectivity include magnesium oxide, zinc oxide, barium sulfate, zinc sulfate, magnesium carbonate, calcium carbonate, wollastonite, and the like which are typical white inorganic materials. The particles composed of the above-described ceramic materials may be selected appropriately and be used in combination.

Simplification of the production steps is mentioned as an advantage of using the epoxy resin sheet 302. The reason is that the epoxy resin sheet 302 can be attached after all surfaces of the aluminum substrate 301 are entirely covered with the anodized aluminum protective layer 311 because the curing facilitation temperature of the epoxy resin is a low 180° C. and, therefore, cracking in the anodized aluminum protective layer 311 does not occur easily.

If the anodized aluminum protective layer 311 is formed on the surface of the aluminum substrate 301 and the temperature is raised to a high temperature of 250° C. or higher, cracking may occur in the anodized aluminum protective layer 311 because of a difference in the thermal expansion coefficient between the aluminum substrate 301 and the anodized aluminum protective layer 311. If cracking occurs once, the aluminum substrate 301 is corroded by the etching solution and the plating solution, which penetrate the aluminum substrate 301 through cracks, in the following production process.

The first insulating layer formation temperature shown in each of the first to third embodiments is a high 250° C. or higher, and in the case where the aluminum substrate 1 is used (in the third embodiment, the aluminum substrate 1 is used instead of the copper substrate 201), when a process of covering with the anodized aluminum protective layer is performed in the first place, the aluminum substrate 1 may be corroded by the etching solution or the plating solution. For example, in the case where a glass binder synthesized by a sol-gel method is used, the drying and firing temperatures are usually a high 250° C. to 500° C. Meanwhile, the temperature at which the PFA sheet 102 or the PTFE sheet 202 is fused to the aluminum substrate 1 is 300° C. or higher. Therefore, it is feared that cracking occurs in the anodized aluminum protective layer and the protective function is degraded.

In each of the first to third embodiments, in the case where the aluminum substrate 1 is used (in the third embodiment, the aluminum substrate 1 is used instead of the copper substrate 201), for the purpose of covering with the anodized aluminum protective layer, the insulating layer is formed by appropriately using the glass binder, the PFA sheet, or the PTFE sheet and, thereafter, the resulting insulating layer and the aluminum substrate 1 are subjected together to the steps of the anodization treatment, the sealing treatment, water washing, and the like. As a result, particular attention should be given to the operations.

On the other hand, in the present embodiment, production is simplified because all surfaces of aluminum substrate 301 are subjected to the anodized aluminum treatment in the first place and, thereafter, the epoxy resin sheet 302 is attached.

APPLICATION EXAMPLE

Various application examples of the light emitting device according to each of the embodiments will be described.

Application Example 1

Figure 18:
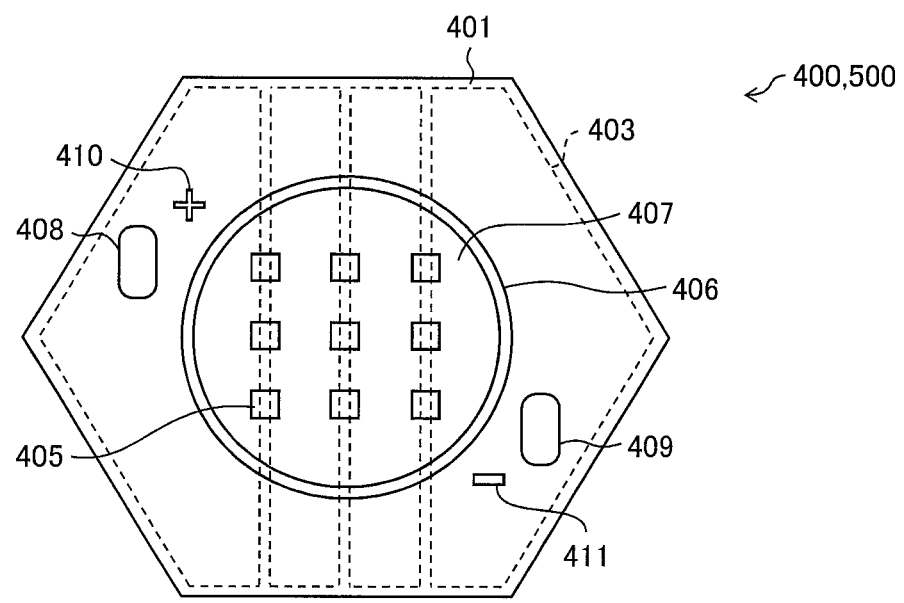
FIG. 18 is a plan view showing an application example and another application example of the light emitting device.
Figure 19:
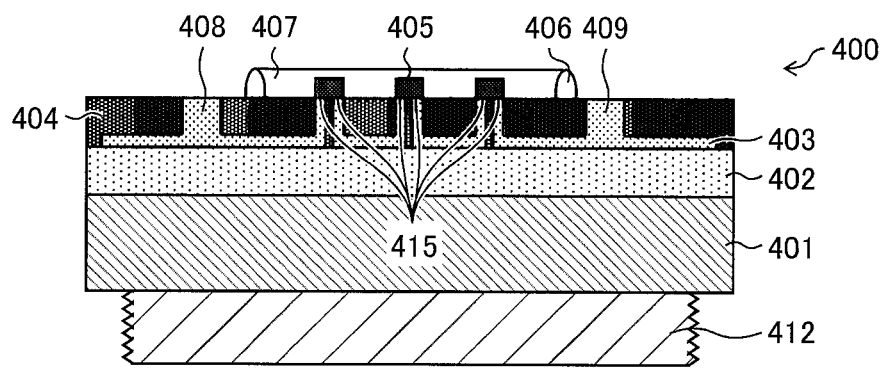
FIG. 19 is a sectional view showing the application example.

FIG. 18 is a plan view showing the application examples.
FIG. 19 is a sectional view showing the application example.

A light emitting device 400 shown in FIG. 18 and FIG. 19 includes a metal substrate (metal substrate portion) 401, a first insulating layer 402, a wiring pattern 403, a second insulating layer 404, and LED chips 405.

The metal substrate 401 is the aluminum substrate 1 or the copper substrate 201.

The first insulating layer 402 is an insulating layer which is disposed on the metal substrate 401, which has thermal conductivity, and which is the high heat dissipation ceramic layer 2 or the PTFE sheet 202.

The wiring pattern 403 is disposed on the first insulating layer 402 and is the etching frame 3 or the etching frame 203. In this regard, the wiring pattern 403 almost entirely covers the surface provided with the first insulating layer 402 (one surface side) of the metal substrate 401. Actually, according to FIG. 18, the wiring pattern 403 almost entirely covers the surface provided with the first insulating layer 402 (one surface side) excluding the portion in which the wiring pattern 403 is electrically separated. Consequently, good heat dissipation effect is exhibited.

The second insulating layer 404 is an insulating layer which is disposed on the first insulating layer 402 and the wiring pattern 403, which has light reflectivity, and which is the highly reflective ceramic layer 4 or the inorganic resist layer 204.

The LED chips 405 are electrically connected to the wiring pattern 403 and are the LED chips 5. In this regard, FIG. 18 shows nine LED chips 405 arranged in a matrix with three rows and three columns. In the connection configuration based on the wiring pattern 403, the nine LED chips 405 are parallel-connected in three columns and each of the three columns has a series circuit of three LED chips 405 (that is, three series-three parallel connection). As a matter of course, the number of LED chips 405 is not limited to nine and the connection configuration of three series-three parallel connection is not necessarily employed.

In addition, the light emitting device 400 includes a light reflective resin frame 406, a phosphor-containing seal resin 407, an anode 408, a cathode 409, an anode mark 410, a cathode mark 411, and a thread portion 412.

The light reflective resin frame 406 is an annular (arc-shaped) frame which is disposed on the wiring pattern 403 and the second insulating layer 404 and which is composed of an alumina filler-containing silicone resin. The material for the light reflective resin frame 406 is not limited to this and needs only to be an insulating resin having light reflectivity. Alumina is used as a filler here, but besides this, white materials typified by titanium oxide, zirconia, silica, and the like may be used as the filler. These inorganic materials may be used in appropriate combination. Also, the shape of the light reflective resin frame 406 is not limited to the annular shape (arc shape) and may be any shape.

The phosphor-containing seal resin 407 is a seal resin layer composed of a transparent resin. The phosphor-containing seal resin 407 is filled in a region surrounded by the light reflective resin frame 406 and seals the wiring pattern 403, the second insulating layer 404, and the LED chips 405. Also, phosphor-containing seal resin 407 contains phosphors. As for the phosphor, a phosphor which is excited by the primary light emitted from the LED chip 405 and which emits the light with a wavelength larger than the wavelength of the primary light is used. The configuration of the phosphor is not specifically limited and can be selected appropriately in accordance with predetermined white chromaticity and the like. For example, a combination of YAG yellow phosphor and $(Sr,Ca)AlSiN_3$: EU red phosphor, a combination of YAG yellow phosphor and $CaAlSiN_3$: EU red phosphor, and the like can be used as the combination for neutral white or warm white. Also, a combination of $(Sr,Ca)AlSiN_3$: EU red phosphor and $Ca_3(Sc,Mg)_2Si_3O_{12}$: Ce green phosphor and the like can be used as the combination of high color rendering. Also, other combinations of phosphors may be used or a configuration containing only YAG yellow phosphor may be used as pseudo-white.

Even in the case where only the primary light emitted from the LED chips 405 is used, for the purpose of sealing and protecting the wiring pattern 403, the second insulating layer 404, and the LED chips 405, a seal resin layer composed of a transparent resin may be formed in the state of containing no phosphor.

The anode 408 and the cathode 409 are electrodes for supplying a current to the LED chips 405 so as to drive the LED chips 405 and are disposed in the form of lands. The anode 408 and the cathode 409 are electrodes which can be connected to an external power supply, although not shown in the drawing, of the light emitting device 400. The anode 408 and the cathode 409 are connected to the LED chips 405 through the wiring pattern 403.

The anode mark 410 and the cathode mark 411 are alignment marks serving as references for positioning the anode 408 and the cathode 409, respectively. Also, the anode mark 410 and the cathode mark 411 have a function of showing the polarity of the anode 408 and the cathode 409, respectively.

The thread portion 412 is a protrusion disposed on the metal substrate 401. When the side provided with the LED chips 405 is specified to be the side of the surface provided with the wiring pattern 403 with reference to the metal substrate 401, the thread portion 412 is disposed on the opposite side of the surface provided with the wiring pattern 403 with reference to the metal substrate 401. That is, in the case where the metal substrate 401 is specified to be the reference, the thread portion 412 is disposed on the side opposite to the first insulating layer 402 and the like. Also, the thread portion 412 is disposed for attaching the light emitting device 400 to another component. For example, the thread portion 412 is configured to serve as an external thread and the other component is provided with an internal thread that is screwed into the thread portion 412. Consequently, the component can be attached to the light emitting device 400 by the thread portion 412 and the internal thread. Examples of the other component include the heatsink 207 (refer to FIG. 12).

Here, as is clear from FIG. 19, the thicknesses of portions, which are just below the anode 408 and the cathode 409, of the wiring pattern 403 are larger than the thickness of the portion, which is other than the portions just below the electrodes, of the wiring pattern 403.

Specifically, it is preferable that the thickness of the wiring pattern 403 just below the anode 408 and the cathode 409 be 70 μm or more and 150 μm or less and the thickness of the portion other than the portions just below the electrodes be 35 μm or more and 75 μm or less. As the thickness of the wiring pattern 403 increases, the heat dissipation function of the light emitting device 400 is enhanced. However, if the thickness of the wiring pattern 403 is more than 150 μm, dramatic enhancement of the heat dissipation function is not expected even when the thickness of the wiring pattern 403 increases.

It is preferable that the area of the base of the wiring pattern 403, that is, the total area of the portion, which is in contact with the first insulating layer 402, of the wiring pattern 403 shown in FIG. 19, be 5 or more times and 10 or less times the total area of rear electrodes 415 of the LED chips 405. The total area of the rear electrodes 415 of the LED chips 405 here refers to the total area of the rear electrodes 415 of all the LED chips 405 mounted on the light emitting device 400. In other words, it is preferable that the area of the base of the wiring pattern 403 per LED chip 405 be 5 or more times and 10 or less times the area of the rear electrodes 415 of an LED chip 405.

In this regard, it is preferable that the area of the base of the wiring pattern 403 be 5 or more times and 10 or less times the total area of the rear electrodes 415 of all the LED chips 405 mounted on the light emitting device 400, but is not limited to this, the heat dissipation effect of the light emitting device 400 is enhanced as the area of the base increases. Specifically, refer to [Additional note: Concept of the present invention] described later and FIG. 22 to FIG. 24.

Meanwhile, regarding the light emitting device 100 in the first embodiment, it is mentioned that the optical coupling efficiency with the reflector can be improved by reducing the area of the light emitting portion. An increase in the area of the base of the wiring pattern 403 is effective in enhancing the heat dissipation effect, whereas the area of the light emitting portion increases. As a result, the optical coupling efficiency with the reflector is reduced and the light emitting device becomes unsuitable for spotlights and the like.

In consideration of them, it is still concluded that the area of the base of the wiring pattern 403 is preferably 5 or more times and 10 or less times the total area of the rear electrodes 415 of all the LED chips 405 mounted on the light emitting device 400. Consequently, the compatibility is ensured between a decrease in the diameter of the light emitting portion based on the integration possibility in the case where flip chip type LED chip is used as the LED chip 405 (for example, diameter is decreased from 47 mm to 27 mm) and efficient heat dissipation in the case where the area of the base of the wiring pattern 403 increases. Here, the explanations of the light emitting device 400 have been made as an example with reference to FIG. 19. The same goes for a light emitting device 500 (refer to FIG. 20) described later.

It can be said that the light emitting device 400 is an application example of the light emitting device 100 or the light emitting device 300.

Application Example 2

Figure 20:
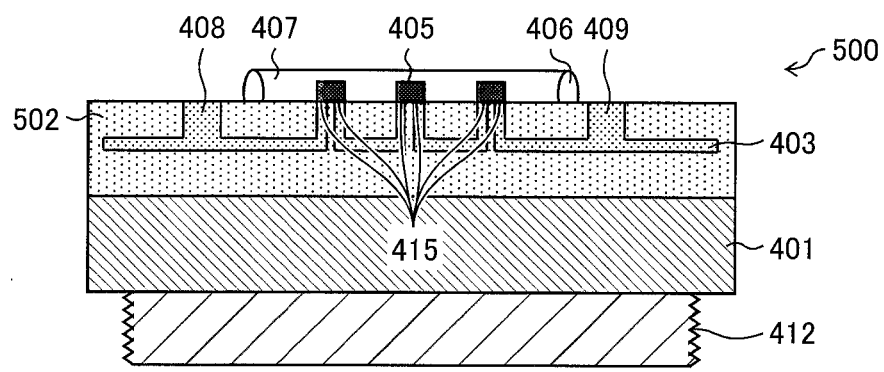
FIG. 20 is a sectional view showing the other application example.

FIG. 20 is a sectional view showing another application example. In this regard, the plan view showing the present example is the same as FIG. 18.

A light emitting device 500 shown in FIG. 18 and FIG. 20 includes a metal substrate 401, an insulating layer 502, a wiring pattern 403, and LED chips 405. That is, the light emitting device 500 includes the insulating layer 502 instead of the first insulating layer 402 and the second insulating layer 404 in the light emitting device 400.

The metal substrate 401, the wiring pattern 403, and the LED chips 405 are the same as those in the light emitting device 400.

However, the wiring pattern 403 is embedded inside the insulating layer 502 while the light emitting device 500 includes the insulating layer 502 instead of the first insulating layer 402 and the second insulating layer 404.

The insulating layer 502 is an insulating layer which is disposed on the metal substrate 401, which has thermal conductivity and light reflectivity, and which is the PFA sheet 102.

Further, the light emitting device 500 includes a light reflective resin frame 406, a phosphor-containing seal resin 407, an anode 408, a cathode 409, an anode mark 410, a cathode mark 411, and a thread portion 412. The configurations thereof in the light emitting device 400 and the light emitting device 500 are the same.

It can be said that the light emitting device 500 is an application example of the light emitting device 200.

Modified Example

A modified example of the light emitting devices 400 and 500 shown in FIG. 18 will be described.

Figure 21:
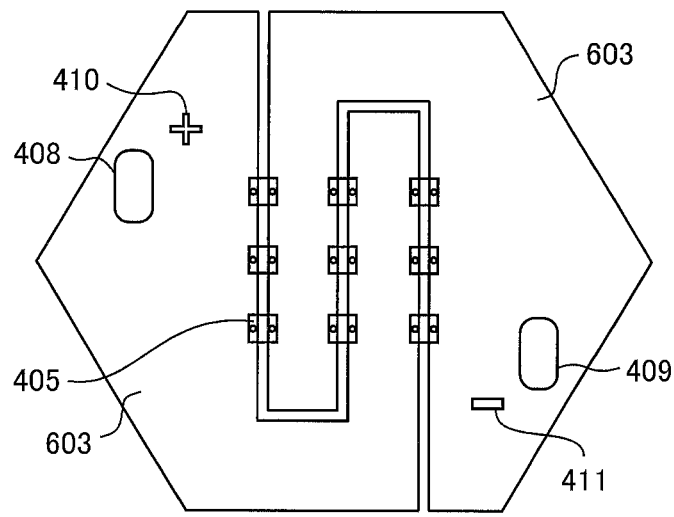
FIG. 21 is a plan view showing a key portion of a modified example of the light emitting device shown in FIG. 18.

FIG. 21 is a plan view showing a key portion of the modified example.

FIG. 21 shows a wiring pattern 603 which is a modified example of the wiring pattern 403. The anode side of the wiring pattern 603 is located just below the anode 408, and the cathode side is located just below the cathode electrode 409.

In this regard, nine LED chips 405 are arranged in a matrix with three rows and three columns, so that the arrangement in the case where the wiring pattern 603 is employed (that is, the modified example) is the same as the arrangement in the case where the wiring pattern 403 is employed (that is, the light emitting elements 400 and 500).

On the other hand, in FIG. 21, nine LED chips 405 has a connection configuration including one parallel circuit of nine LED chips 405 based on the wiring pattern 603. As described above, the connection configuration of the LED chips 405 can be changed appropriately in accordance with the predetermined characteristics of the light emitting device.

[Additional Note: Concept of the Present Invention]

Figure 22:
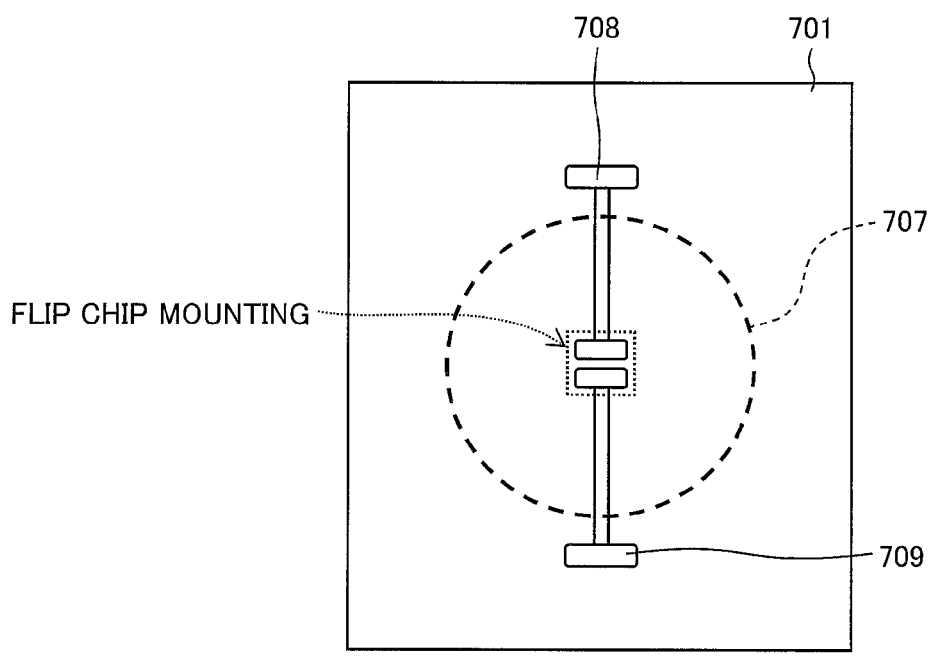
FIG. 22 is a diagram illustrating the concept of the present invention.
Figure 23:
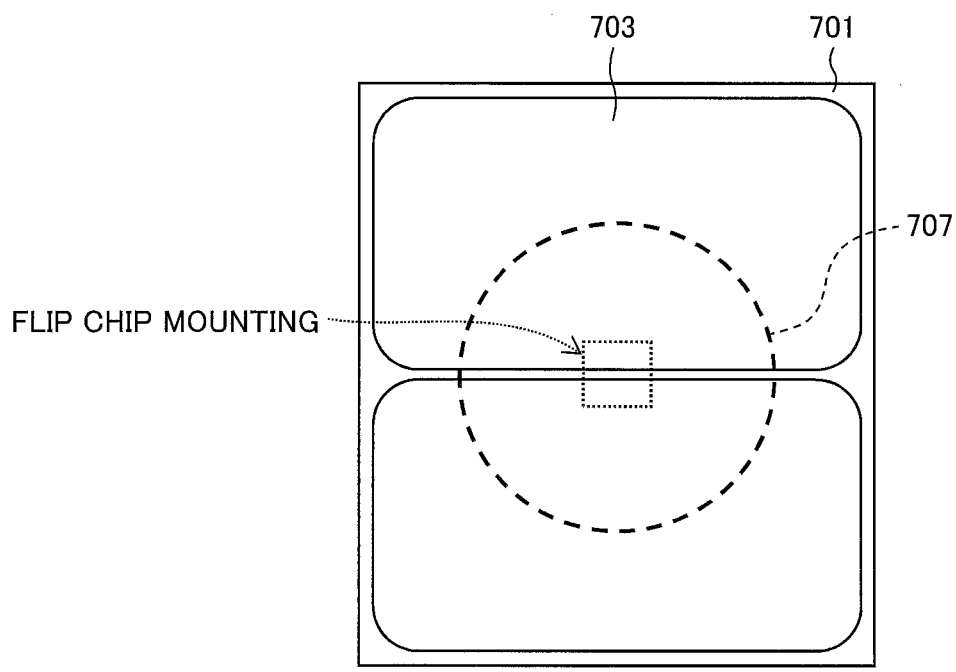
FIG. 23 is a diagram illustrating the concept of the present invention.
Figure 24:
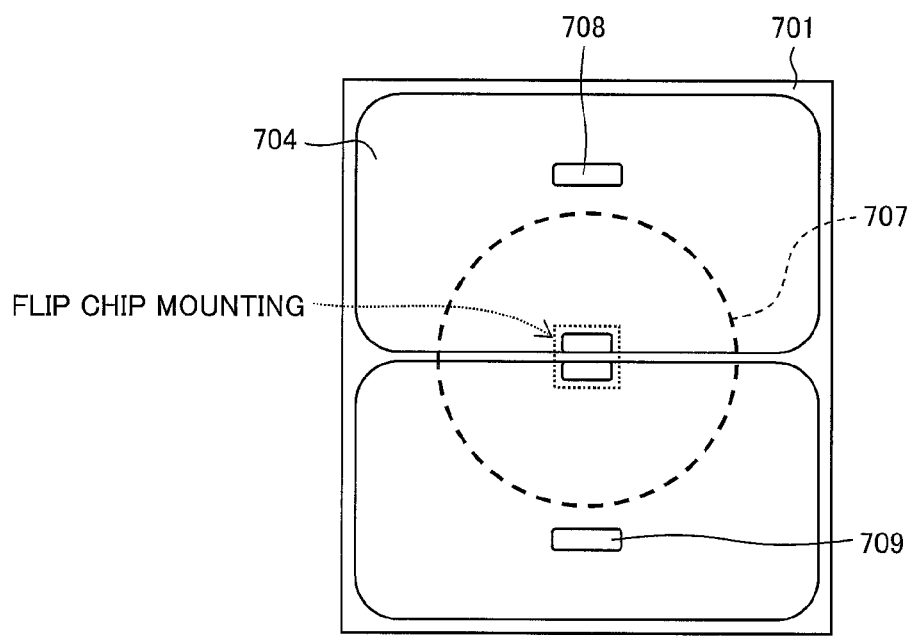
FIG. 24 is a diagram illustrating the concept of the present invention.

FIG. 22 to FIG. 24 are diagrams illustrating the concept of the present invention.

FIG. 22 shows an electronic circuit board 701 provided with a portion to be connected to the LED chip (refer to the description "flip chip mounting" in FIG. 22), although not shown in the drawing, an anode 708, and a cathode 709 as wires. Here, in the electronic circuit board 701, an insulating layer is disposed on a metal substrate. Also, in FIG. 22, a region 707 to be coated with a phosphor-containing seal resin is indicated.

Here, the heat dissipation effect becomes better as the area of wires mounted increases.

Then, it is considered that a configuration shown in FIG. 23 is applied to the electronic circuit board 701. FIG. 23 shows the state in which one surface side of the electronic circuit board 701 is almost entirely covered with the wiring pattern 703.

However, in the case where the wiring pattern 703 is large, the light reflectivity of the wiring pattern 703 is low. Consequently, it is effective to cover the portion other than the portion, which is required for mounting the LED chip, of the wiring pattern 703 with a material having excellent light reflectivity.

Then, it is considered that a configuration shown in FIG. 24 is applied to the electronic circuit board 701 provided with the wiring pattern 703. FIG. 24 shows the state in which the wiring pattern 703 excluding a portion to be connected to the LED chip, the anode 708, and the cathode 709 is covered with an insulating layer 704.

In this regard, there is a description "the area of the base of the wiring pattern 403 is preferably 5 or more times and 10 or less times the total area of the rear electrodes 415 of all the LED chips 405 mounted on the light emitting device 400" in the item of [Application example]. This is an empirical rule obtained by conducting trial production and studies on the basis of the content of the explanation of the present item, in particular, the content illustrated in FIG. 23.

[Supplementation: Relationship Between Area of Light Emitting Portion and Reflector]

Figure 31:
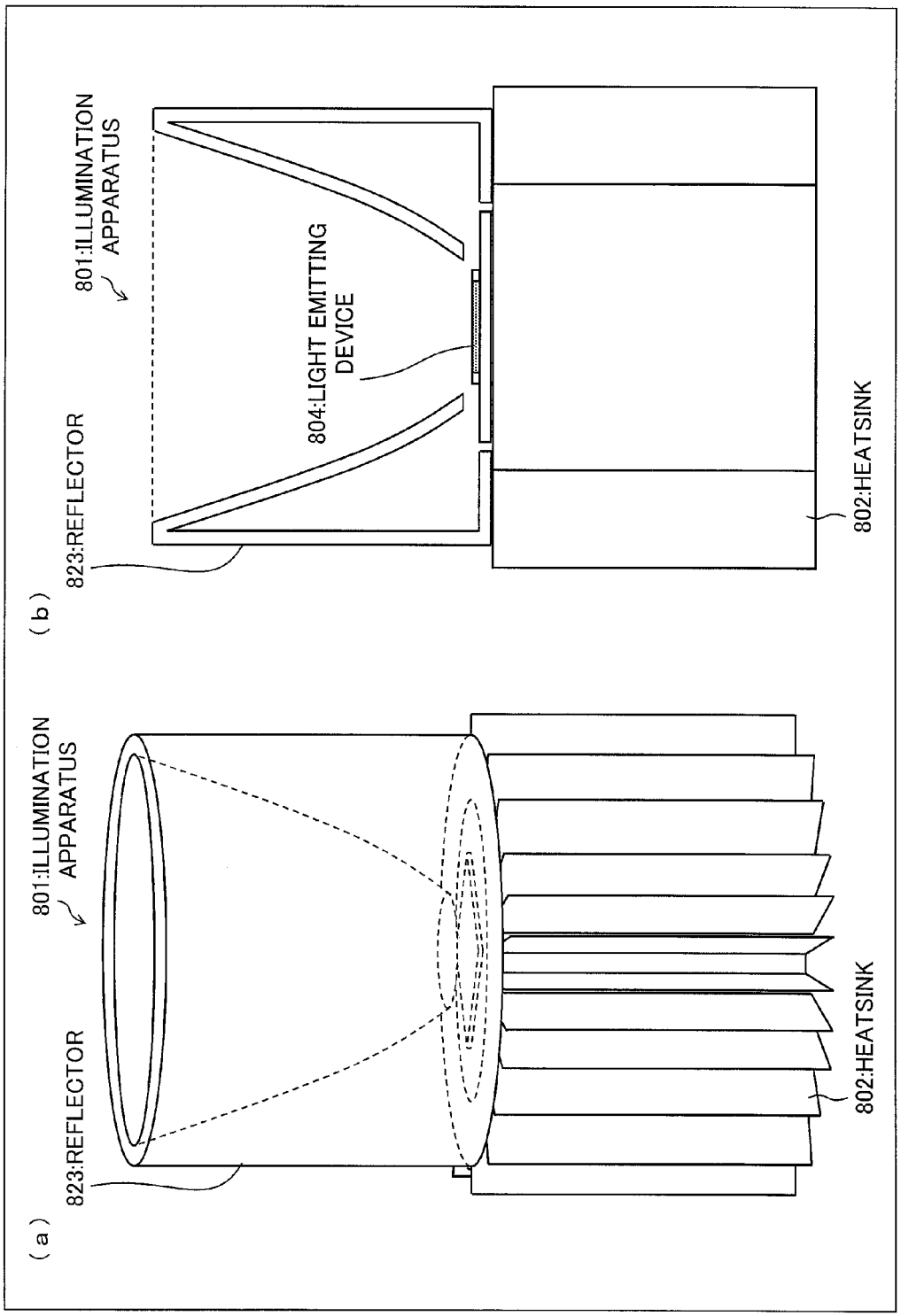
FIG. 31 is a diagram showing the configuration of an illumination apparatus including a light emitting device according to the present invention.

Each light emitting device described above can be applied to, for example, a light emitting device 804 of an illumination apparatus 801 shown in FIG. 31. FIG. 31 (*a*) is a perspective view of the illumination apparatus 801 and FIG. 31 (*b*) is a sectional view of the illumination apparatus 801. The illumination apparatus 801 is produced by using the high quality, inexpensive light emitting device 804. Consequently, the inexpensive, high quality illumination apparatus 801 can be provided to the user. In FIG. 31, reference numeral 802 denotes a heatsink and reference numeral 823 denotes a reflector.

Figure 32:
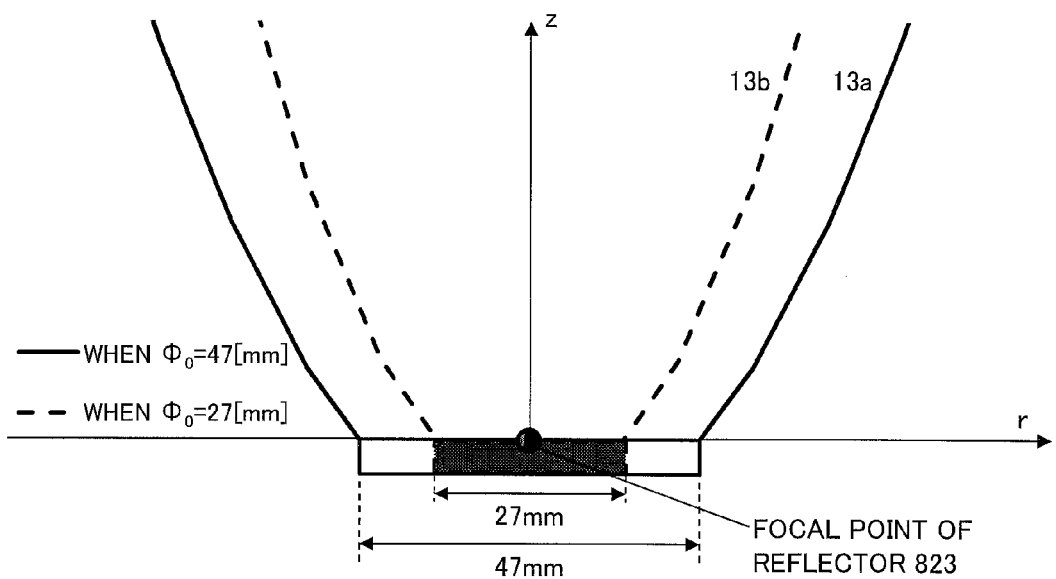
FIG. 32 is an elevational sectional view showing the shape of a reflector.

FIG. 32 is an elevational sectional view showing the shape of a reflector 823. The inner circumferential surface of the reflector 823 is formed into a paraboloid produced by rotating a parabola. A general formula of the paraboloid is represented by the following mathematical expression (1), where the focal point is specified to be (0,a). Here, the z axis is a symmetry axis of the paraboloid and agrees with an optical axis of the light emitted from the light emitting device 804. The r axis is an axis which passes through the focal point of the paraboloid and which is orthogonal to the optical axis.

$$4az=r^2 \quad (1)$$

FIG. 32 shows the coordinates of the inner circumferential surface of the reflector 823 based on the mathematical expression (1), where the diameter of the light emitting portion (corresponding to the inner wall bottom surface of the reflector 823) is specified to be 47 mm or 27 mm. The inner circumferential surface in the case where the diameter of the light emitting portion is 47 mm is indicated by a solid line 13*a* and the inner circumferential surface in the case where the diameter of the light emitting portion is 27 mm is indicated by a broken line 13*b*. The light emitting portion is located in the vicinity of the focal point of the paraboloid constituting the reflector 823.

If the area of the light emitting portion can be decreased, the numerical value "a" in the mathematical expression (1) can be reduced. When the diameter of the light emitting portion is assumed to be $\Phi_0$, the diameter can be represented by $\Phi_0=4a$. When the diameter $\Phi_0$ of the light emitting portion decreases from 47 mm to 27 mm, the inner circumferential surface of the reflector 823 is changed from the solid line 13*a* to the broken line 13*b*.

Consequently, in the case where the depth of the reflector 823 is constant, the light-concentration effect can be enhanced as the numerical value "a" is reduced. Also, even in the case where the reflector 823 having the same shape is used, if the light emitting portion is small, performance close to the performance of a point source of light is exhibited and, therefore, the light-concentration effect can be enhanced.

SUMMARY

The substrate for a light emitting device, according to Aspect 1 of the present invention, includes the metal substrate portion (aluminum substrate 1 and the like) having at least a metal substrate, the first insulating layer (high heat dissipation ceramic layer 2 and the like) which is disposed on the metal substrate portion and which has thermal conductivity, the wiring pattern (etching frame 3 and the like) disposed on the first insulating layer, and the second insulating layer (highly reflective ceramic layer 4 and the like) which is disposed on the first insulating layer and the wiring pattern and which has light reflectivity.

According to the above-described configuration, the wiring pattern is formed directly on the first insulating layer. Consequently, the heat generated in the light emitting element and the like can be dissipated through the wiring pattern and the first insulating layer to the metal substrate portion efficiently.

In addition, according to the above-described configuration, the second insulating layer is disposed on the first insulating layer and the wiring pattern. Consequently, the light utilization efficiency can be improved.

In the substrate for a light emitting device, according to Aspect 2 of the present invention, the first insulating layer of Aspect 1 has thermal conductivity higher than the thermal conductivity of the second insulating layer, and the second insulating layer has light reflectivity higher than the light reflectivity of the first insulating layer.

The substrate for a light emitting device, according to Aspect 3 of the present invention, includes the metal substrate portion having at least the metal substrate, the insulating layer (PFA sheet 102) which is disposed on the metal substrate portion and which has thermal conductivity and light reflectivity, and the wiring pattern embedded inside the insulating layer.

According to the above-described configuration, the wiring pattern is embedded inside the insulating layer. Consequently, the heat generated in the light emitting element and the like can be dissipated through the wiring pattern and the insulating layer to the metal substrate portion efficiently.

In addition, according to the above-described configuration, the wiring pattern is embedded inside the insulating layer. Consequently, the light utilization efficiency can be improved.

Also, according to the above-described configuration, the insulating layer is only one layer, so that the man-hours for disposing the insulating layer can be reduced.

In the substrate for a light emitting device, according to Aspect 4 of the present invention, the insulating layer of Aspect 3 is composed of any one of an epoxy resin, a silicone resin, a fluororesin, and a polyimide resin.

In the substrate for a light emitting device, according to Aspect 5 of the present invention, the insulating layer of Aspect 4 is composed of a sheet-shaped resin.

In the substrate for a light emitting device, according to Aspect 6 of the present invention, the insulating layer of Aspect 5 is composed of the PFA sheet.

In the substrate for a light emitting device, according to Aspect 7 of the present invention, the insulating layer of any one of Aspects 3 to 6 contains ceramic particles.

In the substrate for a light emitting device, according to Aspect 8 of the present invention, the first insulating layer of Aspect 1 is composed of a ceramic paint applied to the metal substrate portion.

In the substrate for a light emitting device, according to Aspect 9 of the present invention, the first insulating layer of Aspect 1 is composed of any one of an epoxy resin, a silicone resin, a fluororesin, and a polyimide resin.

In the substrate for a light emitting device, according to Aspect 10 of the present invention, the first insulating layer of Aspect 9 is composed of the sheet-shaped resin.

In the substrate for a light emitting device, according to Aspect 11 of the present invention, the first insulating layer of Aspect 10 is composed of the PTFE sheet.

In the substrate for a light emitting device, according to Aspect 12 of the present invention, the first insulating layer of any one of Aspects 1, 9, 10, 11 contains ceramic particles.

The substrate for a light emitting device, according to Aspect 13 of the present invention, the second insulating layer of Aspect 1 is composed of any one of an epoxy resin, a silicone resin, a fluororesin, and a polyimide resin, each containing ceramic particles.

In the substrate for a light emitting device, according to Aspect 14 of the present invention, the second insulating layer of Aspect 1 is composed of a glass binder containing ceramic particles.

In the substrate for a light emitting device, according to Aspect 15 of the present invention, the metal substrate portion of any one of Aspects 1 to 14 is formed by covering the surface of aluminum with an anodized aluminum protective layer by an anodization treatment.

The light emitting device according to Aspect 16 of the present invention includes the substrate for a light emitting device, according to any one of Aspects 1, 2, and 8 to 14 and the light emitting element (LED chip 5 and the like) which is disposed on the second insulating layer of the substrate for a light emitting device and which is electrically connected to the wiring pattern.

The light emitting device according to Aspect 17 of the present invention includes the substrate for a light emitting device, according to any one of Aspects 3 to 7, and the light emitting element which is disposed on the insulating layer of the substrate for a light emitting device and which is electrically connected to the wiring pattern.

In the light emitting device according to Aspect 18 of the present invention, the light emitting element of Aspect 16 or Aspect 17 is electrically connected to the wiring pattern by flip chip bonding.

In the light emitting device according to Aspect 19 of the present invention, the total area of the base of the wiring pattern for supplying a current to the light emitting element of Aspect 18 is at least 5 times the total area of the base of rear electrodes of the light emitting element connected to the wiring pattern.

The method for manufacturing a substrate for a light emitting device, according to Aspect 20 of the present invention, includes the steps of producing a metal substrate portion by forming an anodized aluminum protective layer on a substrate composed of aluminum by performing an anodization treatment, forming an electrically conductive layer and a first insulating layer by attaching a composite sheet to the metal substrate portion, where the composite sheet is obtained by attaching a sheet-shaped epoxy resin that contains ceramic particles so as to have enhanced thermal conductivity to a metal sheet composed of copper, forming a wiring pattern from the electrically conductive layer by etching, forming a second insulating layer, which has thermal conductivity lower than the thermal conductivity of the first insulating layer and which has light reflectivity higher than the light reflectivity of the first insulating layer, on the first insulating layer and the wiring pattern by coating and, in addition, exposing an electrode terminal portion of the wiring pattern to be electrically connected to an electrode of the light emitting element, and coating the electrode terminal portion by metal plating.

Further, the present invention can be interpreted as described below.

The light emitting device according to an aspect of the present invention includes the metal substrate (aluminum substrate 1 and the like), the first insulating layer (high heat dissipation ceramic layer 2 and the like) which is disposed on the metal substrate and which has thermal conductivity, the wiring pattern (etching frame 3 and the like) disposed on the first insulating layer, the second insulating layer (highly reflective ceramic layer 4 and the like) which is disposed on the first insulating layer and the wiring pattern and which has light reflectivity, and the light emitting element (LED chip 5 and the like) which is disposed on the second insulating layer and which is electrically connected to the wiring pattern.

According to the above-described configuration, the wiring pattern is formed directly on the first insulating layer. Consequently, the heat generated in the light emitting element and the like can be dissipated through the wiring pattern and the first insulating layer to the metal substrate efficiently.

In addition, according to the above-described configuration, the second insulating layer is disposed on the first insulating layer and the wiring pattern. Consequently, the light utilization efficiency can be improved.

The light emitting device according to another aspect of the present invention includes the metal substrate, the insulating layer (PFA sheet 102) which is disposed on the metal substrate and which has thermal conductivity and light reflectivity, the wiring pattern embedded inside the insulating layer, and the light emitting element which is disposed on the insulating layer and which is electrically connected to the wiring pattern.

According to the above-described configuration, the wiring pattern is embedded inside the insulating layer. Consequently, the heat generated in the light emitting element and the like can be dissipated through the wiring pattern and the insulating layer to the metal substrate efficiently.

In addition, according to the above-described configuration, the wiring pattern is embedded inside the insulating layer. Consequently, the light utilization efficiency can be improved.

Also, according to the above-described configuration, the insulating layer is only one layer, so that the man-hours for disposing the insulating layer can be reduced.

In the light emitting device according to another aspect of the present invention, the insulating layer may be composed of the PFA sheet.

In the light emitting device according to another aspect of the present invention, the light emitting element may be electrically connected to the wiring pattern by flip chip bonding.

In the light emitting device according to another aspect of the present invention, the first insulating layer may be composed of the ceramic paint applied to the metal substrate.

In the light emitting device according to another aspect of the present invention, the first insulating layer may be composed of the PTFE sheet.

In the light emitting device according to another aspect of the present invention, the second insulating layer may be composed of the ceramic paint applied to the first insulating layer and the wiring pattern.

In the light emitting device according to another aspect of the present invention, the material constituting the metal substrate may contain aluminum.

According to the above-described configuration, the metal substrate which is inexpensive, easy-to-process, and resistant to atmospheric humidity can be realized.

In the light emitting device according to another aspect of the present invention, the material constituting the metal substrate may contain copper.

In the light emitting device according to another aspect of the present invention, the thickness of the first insulating layer may be 25 μm or more and 150 μm or less.

According to the above-described configuration, an occurrence of cracking in the first insulating layer is suppressed and, in addition, the metal substrate can be reliably insulated from the wiring pattern.

In the light emitting device according to another aspect of the present invention, the thickness of the second insulating layer may be 20 μm or more and 150 μm or less.

According to the above-described configuration, sufficient electrically insulating property and light reflectivity can be realized.

In the light emitting device according to another aspect of the present invention, the thickness of the PFA sheet may be 70 μm or more and 300 μm or less.

According to the above-described configuration, sufficient electrically insulating property, thermal conductivity, and light reflectivity can be realized.

In the light emitting device according to another aspect of the present invention, the thickness of the PTFE sheet may be 25 μm or more and 150 μm or less.

In the light emitting device according to another aspect of the present invention, the light emitting element may be disposed on the side of the surface provided with the wiring pattern with reference to the metal substrate, and the thread portion for attaching the light emitting device to another component may be disposed on the opposite side of the surface provided with the wiring pattern with reference to the metal substrate.

According to the above-described configuration, the thread portion is disposed for attaching the light emitting device to another component. For example, the thread portion is configured to serve as an external thread and the other component is provided with an internal thread that is screwed into the thread portion. Consequently, the other component can be attached to the light emitting device by the thread portion and the internal thread.

In the light emitting device according to another aspect of the present invention, the thickness of the wiring pattern just below the electrodes for supplying a current, which drives the light emitting element, to the light emitting element may be 70 μm or more and 150 μm or less and the thickness of the portion other than the portions just below the electrodes may be 35 μm or more and 75 μm or less.

As the thickness of the wiring pattern increases, the heat dissipation function of the light emitting device is enhanced. However, if the thickness of the wiring pattern is more than 150 μm, dramatic enhancement of the heat dissipation function is not expected even when the thickness of the wiring pattern increases. Preferably, the thickness of the wiring pattern is determined in consideration of this.

In the light emitting device according to another aspect of the present invention, the area of the electrodes for supplying a current, which drives the light emitting element, to the light emitting element may be at least 5 times the area of the rear electrodes of the light emitting element.

According to the above-described configuration, connection of the external power supply to the electrodes is facilitated and, in addition, upsizing of the light emitting device can be suppressed.

In the light emitting device according to another aspect of the present invention, the wiring pattern may entirely cover one surface side of the metal substrate.

In this regard, the term "entirely cover the surface side" includes the case where the surface side is almost entirely covered (that is, very small part of the surface side is not covered).

According to the above-described configuration, good heat dissipation effect is exhibited.

[Additional Note]

In order to solve the above-described issues, the light emitting device according to an aspect of the present invention may include the metal substrate, the first insulating layer which is disposed on the metal substrate and which has thermal conductivity, the wiring pattern disposed on the first insulating layer, the second insulating layer which is disposed on the first insulating layer and the wiring pattern and which has light reflectivity, and the light emitting element which is disposed on the second insulating layer and which is electrically connected to the wiring pattern.

Also, in order to solve the above-described issues, the light emitting device according to another aspect of the present invention may include the metal substrate, the insulating layer which is disposed on the metal substrate and which has thermal conductivity and light reflectivity, the wiring pattern embedded inside the insulating layer, and the light emitting element which is disposed on the insulating layer and which is electrically connected to the wiring pattern.

The present invention is not limited to the individual embodiments. Various modifications can be made within the scope of the claims, and embodiments based on appropriate combinations of technical measures disclosed in different embodiments are included in the technical scope of the present invention. In addition, new technical features can be made by combining technical measures disclosed in the individual embodiments.

INDUSTRIAL APPLICABILITY

The present invention can be utilized for light emitting devices provided with insulating layers on metal substrates.

REFERENCE SIGNS LIST 1 aluminum substrate (metal substrate portion)
2 high heat dissipation ceramic layer (first insulating layer)
3 etching frame (wiring pattern)
4 highly reflective ceramic layer (second insulating layer)
5 LED chip (light emitting element)
100, 200, 300, 400, and 500 light emitting device
102 PFA sheet (insulating layer)
201 copper substrate (metal substrate portion)
202 PTFE sheet (first insulating layer)
203 etching frame (wiring pattern)
204 inorganic resist layer (second insulating layer)
301 aluminum substrate (metal substrate portion)
302 epoxy resin sheet (first insulating layer)
303 etching frame (wiring pattern)
304 inorganic resist layer (second insulating layer)
311 anodized aluminum protective layer (metal substrate portion)
313 copper plate (electric conductor)
401 metal substrate (metal substrate portion)
402 first insulating layer
403 wiring pattern
404 second insulating layer
405 LED chip
408 anode (electrode)

409 cathode (electrode)
412 thread portion
415 rear electrode
502 insulating layer
603 wiring pattern

The invention claimed is:

1. A light emitting device, comprising:
a metal substrate;
a first insulating layer on the metal substrate and having light reflectivity and thermal conductivity;
a second insulating layer on the first insulating layer and having light reflectivity and thermal conductivity;
a light emitting element; and
a wiring pattern embedded inside the second insulating layer and including (i) an electrode terminal including an exposed portion that electrically connects an electrode of the light emitting element to the electrode terminal and (ii) an anode electrode and a cathode electrode that connect the wiring pattern to an external power supply that drives the light emitting element, wherein
the light emitting element is on the second insulating layer and is flip-chip bonded and electrically connected to the electrode terminal,
the thermal conductivity of the first insulating layer is higher than the thermal conductivity of the second insulating layer,
the light reflectivity of the second insulating layer is higher than the light reflectivity of the first insulating layer,
the wiring pattern includes: a first portion located immediately below the electrode terminal that has a first thickness, a second portion located immediately below the anode electrode and the cathode electrode that has a second thickness, and a third portion located immediately below the second insulating layer that has a third thickness, the first thickness and the second thickness both being thicker than the third thickness,
the anode electrode and the cathode electrode are exposed through the second insulating layer, and
in a cross section of the light emitting device, the electrode terminal includes a first electrode terminal and a second electrode terminal arranged such that a region between the first electrode terminal and the second electrode terminal includes no portion of the wiring pattern and is filled with the second insulating layer.

2. The light emitting device, according to claim 1, wherein the first insulating layer includes a ceramic paint applied to the metal substrate.

3. The light emitting device, according to claim 1, wherein the first insulating layer includes of an epoxy resin, a silicone resin, a fluororesin, and a polyimide resin.

4. The light emitting device, according to claim 3, wherein the first insulating layer includes a sheet-shaped resin.

5. The light emitting device, according to claim 4, wherein the first insulating layer includes a polytetrafluoroethylene (PTFE) sheet.

6. The light emitting device, according to claim 1, wherein the first insulating layer includes ceramic particles.

7. The light emitting device, according to claim 1, wherein the second insulating layer includes one of an epoxy resin, a silicone resin, a fluororesin, and a polyimide resin, each containing ceramic particles.

8. The light emitting device, according to claim 1, wherein the second insulating layer includes a glass binder containing ceramic particles.

9. The light emitting device, according to claim 1, wherein the metal substrate includes aluminum and is defined by covering a surface of the aluminum with an anodized aluminum protective layer by an anodization treatment.

10. The light emitting device according to claim 1, wherein a total area of a base of the wiring pattern that supplies a current to the light emitting element is at least 5 times larger than a total area of a base of rear electrodes of the light emitting element connected to the wiring pattern.

11. A light emitting device, comprising:
a metal substrate;
an insulating layer on the metal substrate and having thermal conductivity and light reflectivity;
a light emitting element; and
a wiring pattern embedded inside the insulating layer and including (i) an electrode terminal including an exposed portion that electrically connects an electrode of the light emitting element to the electrode terminal and (ii) an anode electrode and a cathode electrode that connect the wiring pattern to an external power supply that drives the light emitting element, wherein
the light emitting element is on the insulating layer and is flip-chip bonded and electrically connected to the electrode terminal,
the wiring pattern includes a first portion located immediately below the electrode terminal and has a first thickness, a second portion located immediately below the anode and the cathode and has a second thickness, and a third portion located immediately below the insulating layer and has a third thickness, the first thickness and the second thickness being thicker than the third thickness,
the anode electrode and the cathode electrode are exposed through the insulating layer, and
in a cross section of the light emitting device, the electrode terminal includes a first electrode terminal and a second electrode terminal arranged such that a region between the first electrode terminal and the second electrode terminal includes no portion of the wiring pattern and is filled with the insulating layer.

12. The light emitting device, according to claim 11, wherein the insulating layer includes one of an epoxy resin, a silicone resin, a fluororesin, and a polyimide resin.

13. The light emitting device, according to claim 12, wherein the insulating layer includes a sheet-shaped resin.

14. The light emitting device, according to claim 13, wherein the insulating layer includes a tetrafluoroethylene-perfluoroalkyl vinyl ether copolymer (PFA) sheet.

15. The light emitting device, according to claim 11, wherein the insulating layer includes ceramic particles.

16. The light emitting device according to claim 11, wherein the metal substrate includes aluminum and is defined by covering a surface of the aluminum with an anodized aluminum protective layer by an anodization treatment.

17. The light emitting device according to claim 11, wherein a total area of a base of the wiring pattern that supplies a current to the light emitting element is at least 5 times larger than a total area of a base of rear electrodes of the light emitting element connected to the wiring pattern.

18. A method for manufacturing a light emitting device, comprising:
producing a metal substrate by forming an anodized aluminum protective layer on a surface of a substrate including aluminum by performing an anodization treatment;

forming a conductive layer and a first insulating layer that has thermal conductivity and light reflectivity by attaching a composite sheet to the metal substrate, where the composite sheet is obtained by attaching a sheet-shaped epoxy resin that includes ceramic particles so as to have enhanced thermal conductivity to a metal sheet including copper;

forming a wiring pattern from the conductive layer by etching;

forming a second insulating layer, which has thermal conductivity lower than the thermal conductivity of the first insulating layer and which has light reflectivity higher than the light reflectivity of the first insulating layer, on the first insulating layer and the wiring pattern by coating and, exposing (i) an electrode terminal of the wiring pattern that is electrically connected to an electrode of the light emitting element and (ii) an anode electrode and a cathode electrode that connect the wiring pattern to an external power supply that drives the light emitting element;

coating the electrode terminal by metal plating; and electrically connecting, by flip chip bonding, the light emitting element and the electrode terminal portion on the second insulating layer, wherein the wiring pattern includes: a first portion located immediately below the electrode terminal that has a first thickness, a second portion located immediately below the anode electrode and the cathode electrode that has a second thickness, and a third portion located immediately below the second insulating layer that has a third thickness, the first thickness and the second thickness both being thicker than the third thickness, and in a cross section of the light emitting device, the electrode terminal includes a first electrode terminal and a second electrode terminal arranged such that a region between the first electrode terminal and the second electrode terminal includes no portion of the wiring pattern and is filled with the second insulating layer.

19. The method for manufacturing a light emitting device according to claim 18, wherein the metal substrate includes aluminum and is formed by covering a surface of the aluminum with an anodized aluminum protective layer by an anodization treatment.

20. The method for manufacturing a light emitting device according to claim 18, wherein a total area of a base of the wiring pattern that supplies a current to the light emitting element is at least 5 times larger than a total area of a base of rear electrodes of the light emitting element connected to the wiring pattern.

\* \* \* \* \*